United States Patent
Nishimura et al.

(10) Patent No.: US 9,219,252 B2
(45) Date of Patent: Dec. 22, 2015

(54) ORGANIC EL ELEMENT AND METHOD FOR MANUFACTURING SAME

(71) Applicant: JX NIPPON OIL & ENERGY CORPORATION, Tokyo (JP)

(72) Inventors: Suzushi Nishimura, Yokohama (JP);
Soonmoon Jeong, Seoul (KR);
Toshihiko Shibanuma, London (GB)

(73) Assignee: JX NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 14/537,264

(22) Filed: Nov. 10, 2014

(65) Prior Publication Data

US 2015/0060840 A1    Mar. 5, 2015

Related U.S. Application Data

(63) Continuation of application No. PCT/JP2013/062669, filed on Apr. 30, 2013.

(30) Foreign Application Priority Data

Jun. 11, 2012    (JP) .................................. 2012-132102

(51) Int. Cl.
*H01L 33/58*    (2010.01)
*H01L 51/52*    (2006.01)
(Continued)

(52) U.S. Cl.
CPC ........ *H01L 51/5275* (2013.01); *H01L 51/5206* (2013.01); *H01L 51/56* (2013.01); *H05B 33/10* (2013.01); *H05B 33/28* (2013.01); *H01L 2251/5392* (2013.01); *H01L 2251/558* (2013.01)

(58) Field of Classification Search
CPC .......................... H01L 27/32; H01L 51/5268
USPC ................................................. 438/29; 257/98
See application file for complete search history.

(56) References Cited

U.S. PATENT DOCUMENTS

2002/0079835 A1 *  6/2002  Lee ............................... 313/506
2005/0205863 A1 *  9/2005  Choi et al. ...................... 257/40
(Continued)

FOREIGN PATENT DOCUMENTS

EP          1566854 A1 *  8/2005   ............. H01L 51/20
JP      2004022176 A  *  1/2004   ............. H05B 33/22
(Continued)

OTHER PUBLICATIONS

International Search Report issued in International Patent Application No. PCT/JP2013/062669 dated Aug. 6, 2013.
(Continued)

*Primary Examiner* — George Fourson, III
(74) *Attorney, Agent, or Firm* — Oliff PLC

(57) ABSTRACT

In an organic EL element, a concave-convex pattern layer having a first concave-convex shape, a first electrode, an organic layer, and a second electrode layer are stacked on a substrate in this order. Further, an auxiliary layer is provided between the concave-convex pattern layer and the first electrode. A surface of the auxiliary layer on the first electrode side has a second concave-convex shape. The change ratio of the standard deviation of depths of the second concave-convex shape with respect to the standard deviation of depths of the first concave-convex shape is 70% or less. The organic EL light-emitting element, which has a high light extraction efficiency while preventing the occurrence of a leak current, can be obtained.

11 Claims, 9 Drawing Sheets

(51) Int. Cl.
*H05B 33/10* (2006.01)
*H05B 33/28* (2006.01)
*H01L 51/56* (2006.01)

(56) References Cited

U.S. PATENT DOCUMENTS

| | | | |
|---|---|---|---|
| 2005/0266693 A1* | 12/2005 | Maekawa | 438/720 |
| 2012/0132897 A1 | 5/2012 | Seki et al. | |
| 2012/0187435 A1* | 7/2012 | Gy et al. | 257/98 |
| 2012/0286250 A1 | 11/2012 | Yamamoto et al. | |
| 2012/0286258 A1* | 11/2012 | Naraoka et al. | 257/40 |
| 2013/0240852 A1* | 9/2013 | Yamazaki | 257/40 |
| 2014/0021450 A1* | 1/2014 | Young et al. | 257/40 |
| 2014/0042426 A1 | 2/2014 | Nishimura et al. | |
| 2014/0231776 A1 | 8/2014 | Takahashi et al. | |
| 2014/0306213 A1 | 10/2014 | Sato et al. | |
| 2015/0069361 A1* | 3/2015 | Sato et al. | 257/40 |
| 2015/0090992 A1* | 4/2015 | Miyazawa et al. | 257/40 |

FOREIGN PATENT DOCUMENTS

| | | |
|---|---|---|
| JP | A-2006-236748 | 9/2006 |
| JP | A-2011-44296 | 3/2011 |
| JP | A-2011-48937 | 3/2011 |
| JP | A-2012-178279 | 9/2012 |
| KR | 10-2012-0054887 A | 5/2015 |
| WO | WO 2011/007878 A1 | 1/2011 |
| WO | WO 2012/147759 A1 | 11/2012 |
| WO | WO 2013/065384 A1 | 5/2013 |
| WO | WO 2013/073434 A1 | 5/2013 |

OTHER PUBLICATIONS

Office Action issued in Japanese Patent Application No. 2014-521016 dated Oct. 7, 2014 (with translation).

Aug. 4, 2015 Notice to Submit a Response issued in Korean Application No. 10-2014-7029904.

* cited by examiner

Fig. 12

| | EX. 1 | EX. 2 | EX. 3 | EX. 4 | EX. 5 | EX. 6 | EX. 7 | COM. EX. 1 | COM. EX. 2 | COM. EX. 3 | COM. EX. 4 | COM. EX. 5 | COM. EX. 6 | COM. EX. 7 |
|---|---|---|---|---|---|---|---|---|---|---|---|---|---|---|
| ITO FILM THICKNESS (nm) | 80 | 80 | 80 | 120 | 80 | 80 | 80 | 80 | 80 | 80 | 80 | 120 | 80 | 80 |
| $TiO_2$ FILM THICKNESS (nm) | 21 | 41 | 53 | 74 | 21 | 41 | 53 | 0 | 0 | 41 | 100 | 96 | 0 | 0 |
| TOTAL FILM THICKNESS (nm) | 101 | 121 | 133 | 194 | 101 | 121 | 133 | 80 | 80 | 121 | 180 | 216 | 80 | 80 |
| TOTAL OPTICAL FILM THICKNESS (nm) | 202 | 242 | 266 | 388 | 202 | 242 | 266 | 160 | 160 | 242 | 360 | 432 | 160 | 160 |
| SHAPE CHANGE RATIO (%) | 27.2 | 41.4 | 59.3 | 64.1 | 27.2 | 41.4 | 59.3 | – | 0 | – | 75 | 74 | – | 0 |
| ELECTRIC CURRENT EFFICIENCY cd/A (10000cd/m2) | 87.7 | 82 | 71.1 | 64 | 143.6 | 139.1 | 130.8 | 59.9 | 80.7 | 65.6 | 55.6 | 68 | 103.8 | 132.4 |
| YIELD (%) | 90 | 90 | 90 | 90 | 90 | 90 | 90 | 100 | 70 | 100 | 90 | 90 | 100 | 70 |

ORGANIC EL ELEMENT AND METHOD FOR MANUFACTURING SAME

CROSS REFERENCE TO RELATED APPLICATION

This application is a continuation application of International Patent Application No. PCT/JP2013/062669 filed on Apr. 30, 2013 claiming the benefit of priority of Japanese Patent Application No. 2012-132102 filed on Jun. 11, 2012. The contents of International Patent Application No. PCT/JP2013/062669 and Japanese Patent Application No. 2012-132102 are incorporated herein by reference in their entities.

BACKGROUND OF THE INVENTION

1. Field of the Invention

The present invention relates to an organic EL element (Organic Electro-Luminescence element or organic light emitting diode) which has a high light extraction efficiency and is capable of preventing the occurrence of a leak current effectively, and a method for manufacturing the same.

2. Description of the Related Art

There has been known a nanoimprint method, in addition to a lithography method, as a method for forming a minute or fine pattern such as a semiconductor integrated circuit. The nanoimprint method is a technique such that a pattern of an order of nanometer can be transferred by sandwiching a resin between a mold and a substrate. A thermal nanoimprint method, a photonanoimprint method, and the like have been studied depending on the employed material. Of the above methods, the photonanoimprint method includes four steps of: i) resin coating (application of a resin layer); ii) pressing by use of the mold; iii) photo-curing; and iv) mold-releasing. The photonanoimprint method is excellent in that processing on a nanoscale can be achieved by the simple process as described above. Especially, since a photo-curable resin curable by being irradiated with light is used as the resin layer, a period of time for a pattern transfer step is short and high throughput is promised. Thus, the photonanoimprint method is expected to come into practical use in many fields including, for example, an optical member such as an organic EL element and LED, MEMS, and a biochip, in addition to a semiconductor device.

In the organic EL element (organic light emitting diode), a hole injected from an anode through a hole injecting layer and electron injected from a cathode through an electron injecting layer are carried to a light emitting layer respectively, then the hole and electron are recombined on an organic molecule in the light emitting layer to excite the organic molecule, and thus light emission occurs. Therefore, in a case that the organic EL element is used as a display device and/or an illumination device, the light from the light emitting layer is required to be efficiently extracted from the surface of the organic EL element. In order to meet this demand, Japanese Patent Application Laid-open No. 2006-236748 discloses that a diffraction-grating substrate having a concave-convex structure is provided on a light extraction surface of the organic EL element.

The light emitted from the light-emitting layer goes outside through an electrode, and thus a thin film made of indium tin oxide (ITO) having a light-transmissive property is generally used in one of a pair of electrodes. The light emitted from the light-emitting layer goes outside through the ITO thin film and a substrate with the ITO thin film formed thereon. The refractive index of the transparent electrode is generally higher than the refractive index of the substrate. For example, the refractive index of the glass substrate is about 1.5 and the refractive index of the ITO thin film is about 2.0. Such a relation between the refractive index of the transparent electrode and the refractive index of the substrate is more likely to cause the total reflection of the light emitted from the light-emitting layer at an interface between the transparent electrode and the substrate. As a result, the light emitted from the light-emitting layer is trapped in an element, which causes a problem such that the efficiency of the extraction of the light from the substrate deteriorates.

Japanese Patent Application Laid-open No. 2011-44296 discloses a method for manufacturing a substrate with electrodes for an organic Electro-Luminescence element, wherein the substrate with electrodes is configured such that a low refractive index layer, a functional layer, and an electrode having a light transmissive property are stacked in this order, and wherein the refractive index n1 of the electrode, the refractive index n2 of the functional layer, and the refractive index n3 of the low refractive index layer satisfy $0 \le (n1-n2) \le 0.3$ and $n3 < n2 \le n1$. In this manufacturing method, the difference between the refractive index of the functional layer and the refractive index of the electrode is small, and thus the total reflection at an interface between the functional layer and the electrode is inhibited and the light emitted from a light emitting layer and coming into the electrode is efficiently transmitted to the functional layer. Further, by forming the interface between the functional layer and the low refractive index layer to have a concave-convex shape, the concavities and convexities function as a microlens, which inhibits the total reflection at the interface between the functional layer and the low refractive index layer. Accordingly, the light coming into the functional layer from the electrode is transmitted to the low refractive index layer efficiently. Further, the substrate has a layer structure such that a layer closer to the outside (air) has a smaller refractive index, and thus it is possible to reduce the difference between the refractive index of air and the refractive index of a layer contacting with air (low refractive index layer). Japanese Patent Application Laid-open No. 2011-44296 further discloses that a surface of the functional layer on the electrode side is formed to be flat.

In order to improve the light extraction efficiency and the visibility of an organic EL light-emitting element, Japanese Patent Application Laid-open No. 2011-48937 discloses an organic EL light-emitting element 1 as follows. That is, as depicted in FIG. 11 of Japanese Patent Application Laid-open No. 2011-48937, a first electrode 3, an organic layer 4, and a second electrode 5 are stacked on a substrate 2 in this order. A minute concave-convex structure 6 of which arrangement or array pitches are not more than incoming wavelengths is provided between the substrate 2 and the first electrode 3 on the side of the substrate 2, and a transparent layer 7 is provided on the side of the first electrode 3. The refractive index n1 of the substance constituting the substrate 2 is not less than the refractive index n2 of the substance constituting the minute concave-convex structure ($n1 \ge n2$), and thus the difference between the refractive index of the substrate 2 and the refractive index of the first electrode 3 is inclined. Then, the reflection at the interface due to the difference between the refractive indexes is reduced, and thereby making it possible to improve the light extraction efficiency in Japanese Patent Application Laid-open No. 2011-48937. Especially, by filling the concavities and convexities of the minute concave-convex structure 6 to make the transparent layer 7 flat, a thin film of the first electrode 3 formed on the transparent layer 7 does not have uneven film thickness, which removes the possibility of occurrence of a short circuit in Japanese Patent Application Laid-open No. 2011-48937.

In the structure of the organic EL light-emitting element described in each of Japanese Patent Application Laid-open No. 2011-44296 and Japanese Patent Application Laid-open No. 2011-48937, the light extraction efficiency is improved by providing the layer of the minute concave-convex structure on the substrate and providing the layer for adjusting the refractive index which has a planarized or flattened surface between the first electrode and the layer of the minute concave-convex structure. However, the investigation and study of the applicant of the present application showed that the technique described in the above patent literatures did not yet have sufficient light extraction efficiency. Further, in a case that the diffraction-grating substrate having the concave-convex structure is provided on the light extraction surface of the organic EL element, the occurrence of a leak current due to the concave-convex structure is required to be inhibited. Therefore, an organic EL light-emitting element, which has a sufficient light extraction efficiency while inhibiting the occurrence of the leak current, is expected to be developed in order that the organic EL light-emitting element is put into practical use in many fields such as a display and lighting.

In view of the above, an object of the present invention is to provide an organic EL light-emitting element which has a high light extraction efficiency while inhibiting the occurrence of a leak current.

SUMMARY OF THE INVENTION

According to a first aspect of the present invention, there is provided an organic EL element, including: a concave-convex pattern layer having a first concave-convex shape, a first electrode, an organic layer, and a second electrode layer formed on a substrate in this order; and an auxiliary layer provided between the concave-convex pattern layer and the first electrode, wherein a surface of the auxiliary layer on a side of the first electrode has a second concave-convex shape; and a change ratio of a standard deviation of depths of the second concave-convex shape with respect to a standard deviation of depths of the first concave-convex shape is 70% or less.

In the organic EL element of the present invention, the concave-convex shape on the surface of the auxiliary layer is controlled so that the change ratio of the standard deviation of the depths of the second concave-convex shape with respect to the standard deviation of the depths of the first concave-convex shape is 70% or less. Thus, it is possible to improve the light extraction efficiency while preventing the occurrence of a leak current.

In the organic EL element of the present invention, the change ratio of the standard deviation of the depths of the second concave-convex shape with respect to the standard deviation of the depths of the first concave-convex shape may be in a range of 20% to 70%.

In the organic EL element of the present invention, the total of optical film thicknesses of the auxiliary layer and the first electrode may be in a range of 160 nm to 400 nm. The first electrode may be made of ITO and may have a film thickness of 80 nm or more. The auxiliary layer may be made of $TiO_2$. Both the concave-convex pattern layer and the auxiliary layer may be made of an inorganic material such as sol-gel material. The concave-convex pattern layer may be made of silica.

In the organic EL element of the present invention, in a case that refractive indexes of the substrate, the concave-convex pattern layer, the auxiliary layer, and the first electrode are represented by $n0$, $n1$, $n2$, and $n3$, respectively, the following relation: $n2 \geq n3 > n1 \leq 0$ may be satisfied.

In the organic EL element of the present invention, the concave-convex pattern layer may include an irregular concave-convex pattern in which orientations of concavities and convexities have no directivity. The average pitch of concavities and convexities of the concave-convex pattern layer may be in a range of 100 nm to 1200 nm, the average height of the concavities and convexities may be in a range of 20 nm to 200 nm, and the standard deviation of depths of the concave-convex shape may be in a range of 10 nm to 100 nm.

According to a second aspect of the present invention, there is provided a method for manufacturing the organic EL element, including: forming the concave-convex pattern layer, the auxiliary layer, the first electrode, the organic layer, and the second electrode layer on a substrate in this order; and forming the auxiliary layer to make a surface of the auxiliary layer on a side of the first electrode have a second concave-convex shape, wherein a change ratio of a standard deviation of depths of the second concave-convex shape with respect to a standard deviation of depths of the first concave-convex shape is 70% or less. The concave-convex pattern layer may be formed by coating the substrate with a sol-gel material, pressing a film-shaped mold against the substrate, and then heating the substrate.

In the organic EL element of the present invention, the auxiliary layer is provided between the concave-convex pattern layer on the substrate and the first electrode. The second concave-convex shape of the auxiliary layer on the first electrode side is controlled so that the change ratio of the standard deviation of depths of the second concave-convex shape with respect to the standard deviation of depths of the first concave-convex shape is 70% or less. Thus, it is possible to prevent the occurrence of a leak current effectively while maintaining a superior light extraction efficiency.

BRIEF DESCRIPTION OF THE DRAWINGS

FIG. 12 is a table showing the film thickness of the $TiO_2$ film, the film thickness of the transparent electrode (ITO), the total film thickness thereof, the optical film thickness of the total film thickness, the shape change ratio, current efficiency, and the like, of the organic EL element obtained in each of Examples and Comparative Examples (indicated as "EX." and "COM. EX." in FIG. 12).

DESCRIPTION OF THE PREFERRED EMBODIMENTS

Figure 1:
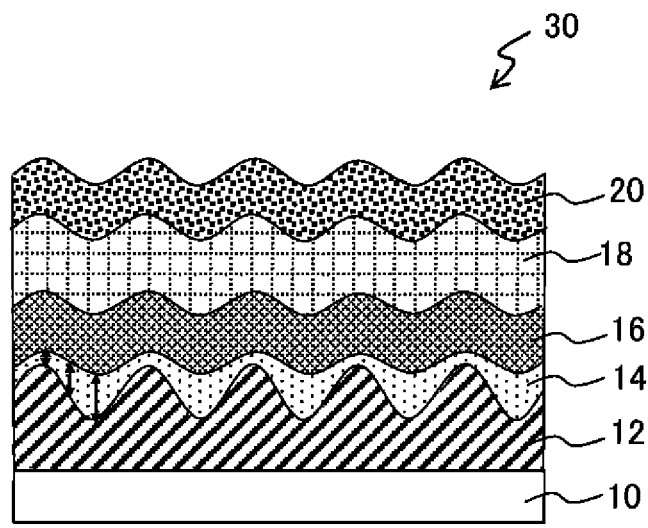
FIG. 1 is a schematic cross-sectional view depicting a cross-section structure of an organic EL element of the present invention.

An embodiment of an organic EL element of the present invention will be explained with reference to the drawings. As depicted in FIG. 1, in the organic EL element of the present invention, a concave-convex pattern layer 12, an auxiliary layer 14, a first electrode layer 16, an organic layer 18, and a second electrode layer 20 are stacked on a substrate 10 in this order.

[Substrate]

As the substrate, substrates made of inorganic materials such as glass, silica glass, and silicon substrates or substrates of resins such as polyethylene terephthalate (PET), polyethylene terenaphthalate (PEN), polycarbonate (PC), cycloolefin polymer (COP), polymethyl methacrylate (PMMA), polystyrene (PS), polyimide (PI), and polyarylate may be used. The substrate may be transparent or opaque. A relatively hard substrate is preferred from the perspective that the organic layer 18 is formed on this substrate via the concave-convex pattern layer 12, which is made of sol-gel material and the like, and the first electrode layer 16. In terms of the uses or applications of the organic EL element, the substrate desirably has the heat resistance and the weather resistance to UV light and the like. In these respects, substrates made of inorganic materials such as glass, silica glass, and silicon substrates are more preferable. Especially, in a case that the substrate is made from the inorganic materials and that the concave-convex pattern layer is made from the inorganic materials such as a sol-gel material layer, the difference between the refractive index of the substrate and the refractive index of the sol-gel material layer is small and unintended refraction and/or reflection in the optical substrate can be prevented. Thus, the substrates made of the inorganic materials are preferred. It is allowable to perform a surface treatment or provide an easy-adhesion layer on the substrate in order to improve an adhesion property, and to provide a gas barrier layer in order to keep out moisture and/or gas such as oxygen.

[Concave-Convex Pattern Layer]

The concave-convex pattern layer 12 formed on the substrate 10 is a layer having a minute concave-convex pattern formed on the surface thereof. The minute concave-convex pattern acts as follows. That is, the visible light generated from the organic layer 18 (for example, the light having a wavelength band ranging from 380 nm to 780 nm), especially the light travelling in a direction which is inclined to the surface of the substrate 10, is diffracted toward the substrate 10, so that the diffracted light is extracted from the substrate 10. In order to allow the concave-convex pattern layer 12 to act as the diffraction grating, the average pitch of the concavities and convexities of the concave-convex pattern may be, for example, in a range of 100 nm to 1500 nm, more preferably in a range of 200 nm to 1200 nm. In a case that the average pitch of the concavities and convexities is less than the lower limit, the pitches are so small relative to wavelengths of the visible light that the diffraction of light by the concavities and convexities is likely to be insufficient. In a case that the average pitch exceeds the upper limit, a diffraction angle is so small that functions as an optical element such as the diffracting grating are more likely to be lost. The average height of the concavities and convexities of the concave-convex pattern is preferably in a range of 20 nm to 200 nm, and more preferably in a range of 30 nm to 150 nm.

The average height of the concavities and convexities is obtained as follows. For example, a concavity and convexity analysis image is obtained by use of an atomic force microscope; distances between randomly selected concave portions and convex portions in the depth direction are measured at 100 points or more in the concavity and convexity analysis image; and the average of the distances can be calculated as the average height (depth) of the concavities and convexities. In the present application, "the standard deviation of depths of the concavities and convexities" which will be described later is used as an index expressing the heights of the concavities and convexities (i.e., the depths of the concavities and convexities) of the concave-convex pattern or the variation of the heights (depths) of the concavities and convexities of the concave-convex pattern. The respective positions of the concave-convex pattern in the height direction vary in an up-down direction with respect to the center position of the average height of the concavities and convexities. Therefore, the standard deviation of depths of the concavities and convexities can also be an index expressing the depths of the concavities and convexities. The standard deviation of depths of the concavities and convexities can be calculated by a concavity and convexity analysis image obtained by the atomic force microscope and the average value of depth distribution of the concavities and convexities obtained therefrom. The standard deviation of depths of the concavities and convexities of the concave-convex pattern is preferably in a range of 10 nm to 100 nm, and more preferably in a range of 15 nm to 75 nm.

It is preferred that the concave-convex pattern be an irregular concave-convex pattern in which the pitches of concavities and convexities are ununiform and the orientations of the concavities and convexities have no directivity. Then, the light scattered and/or diffracted by such a concave-convex pattern layer has a range of wavelength relatively broad other than single wavelength or wavelength having a narrow band, has no directivity, and is directed in various directions. Note that the "irregular concave-convex pattern" includes such a quasi-periodic structure wherein a Fourier-transformed image, which is obtained by performing a two-dimensional fast Fourier-transform processing on a concavity and convexity analysis image obtained by analyzing a concave-convex shape on the surface, shows a circular or annular pattern, that is, such a quasi-periodic structure wherein the pitches of the concavities and convexities have a particular distribution although the concavities and convexities have no particular orientation.

It is preferred that inorganic materials be used as the materials of the concave-convex pattern layer 12. Especially, it is possible to use silica, materials based on Ti, materials based on indium tin oxide (ITO), and sol-gel materials such as ZnO, $ZrO_2$, $Al_2O_3$. Of the above materials, the silica is preferably used. The thickness of the concave-convex pattern layer 12 is preferably in a range of 100 nm to 500 nm. In a case that the thickness of the concave-convex pattern layer is less than 100 nm, the transfer of the concave-convex shape by use of imprinting method is difficult. In a case that the thickness of the concave-convex pattern layer exceeds 500 nm, any structural defect such as a crack is more likely to occur.

Figure 3:
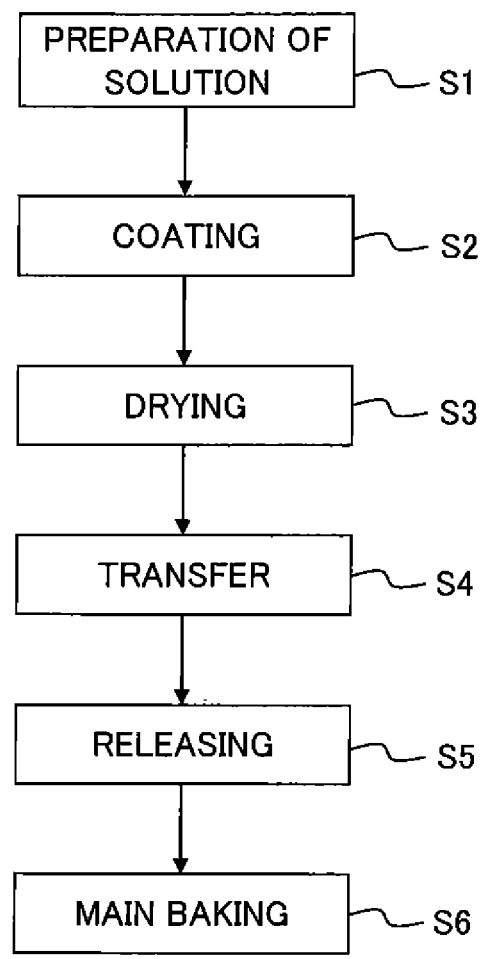
FIG. 3 is a flowchart showing a process for forming a concave-convex pattern layer of the organic EL element of the present invention.

In a case that the concave-convex pattern layer 12 is made of the sol-gel material, the concave-convex pattern layer 12 can be formed on the substrate by the method illustrated in FIG. 3. This method mainly includes a solution preparation step S1 for preparing a sol (sol solution); a coating step S2 for coating a substrate with the prepared sol (applying the prepared sol on a substrate); a drying step S3 for drying the coating film of the sol coating the substrate; a transfer step S4 for pressing a film-shaped mold against the dried coating film; a releasing step (peeling step) S5 for releasing (peeling off) the mold from the coating film; and a main baking step S6 in which the coating film is subjected to main baking. Hereinbelow, an explanation will be made about each of the steps sequentially.

At first, there is prepared the sol used for forming a coating film to which a pattern is transferred using a sol-gel method (step S1 of FIG. 3). For example, in a case that silica is synthesized on a substrate by the sol-gel method, a sol of metal alkoxide (silica precursor) is prepared. As the silica precursor, it is possible to use tetraalkoxide monomers such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyl trimethoxysilane, ethyl trimethoxysilane, propyl trimethoxysilane, isopropyl trimethoxysilane, phenyl trimethoxysilane, methyl triethoxysilane (MTES), ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane; and dialkoxide monomers such as dimethyl dimethoxysilane, dimethyl diethoxysilane, dimethyl dipropoxysilane, dimethyl diisopropoxysilane, dimethyl-di-n-butoxysilane, dimethyl-di-i-butoxysilane, dimethyl-di-sec-butoxysilane, dimethyl-di-t-butoxysilane, diethyl dimethoxysilane, diethyl diethoxysilane, diethyl dipropoxysilane, diethyl diisopropoxysilane, diethyl-di-n-butoxysilane, diethyl-di-i-butoxysilane, diethyl-di-sec-butoxysilane, diethyl-di-t-butoxysilane, dipropyl dimethoxysilane, dipropyl diethoxysilane, dipropyl dipropoxysilane, dipropyl diisopropoxysilane, dipropyl-di-n-butoxysilane, dipropyl-di-i-butoxysilane, dipropyl-di-sec-butoxysilane, dipropyl-di-t-butoxysilane, diisopropyl dimethoxysilane, diisopropyl diethoxysilane, diisopropyl dipropoxysilane, diisopropyl diisopropoxysilane, diisopropyl-di-n-butoxysilane, diisopropyl-di-i-butoxysilane, diisopropyl-di-sec-butoxysilane, diisopropyl-di-t-butoxysilane, diphenyl dimethoxysilane, diphenyl diethoxysilane, diphenyl dipropoxysilane, diphenyl diisopropoxysilane, diphenyl-di-n-butoxysilane, diphenyl-di-i-butoxysilane, diphenyl-di-sec-butoxysilane, diphenyl-di-t-butoxysilane. Further, it is possible to use alkyl trialkoxysilane or dialkyl dialkoxysilane which has alkyl group having C4 to C18 carbon atoms. It is possible to use metal alkoxide such as a polymer obtained by polymerizing the above monomers in small amounts and a composite material characterized in that functional group and/or polymer is/are introduced into a part of the above material. Further, a part of or the entire of the alkyl group and/or the phenyl group may be substituted by fluorine. Furthermore, the silica precursor is exemplified, for example, by metal acetylacetonate, metal carboxylate, oxychloride, chloride, and mixtures thereof. The silica precursor, however, is not limited to these. Examples of metal species include, in addition to Si, Ti, Sn, Al, Zn, Zr, In, and mixtures thereof, but are not limited to these. It is also possible to use any appropriate mixture of precursors of the oxides of the above metals. Further, these surfaces may be subjected to a hydrophobic treatment. Any known method may be used as the method for hydrophobic treatment, for example, in a case that the hydrophobic treatment is performed on the surface made of silica, any of the following methods may be used. That is, the hydrophobic treatment can be performed by using dimethyl dichlorosilane, trimethyl alkoxysilane, or the like; the hydrophobic treatment can be performed by silicone oil and a trimethyl silylation agent such as hexamethyldisilazane; and a surface treatment of metal-oxide powder by use of supercritical carbon dioxide can be used.

In a case that a mixture of TEOS and MTES is used, the mixture ratio thereof can be 1:1, for example, in a molar ratio. The sol produces amorphous silica by performing hydrolysis and polycondensation reaction. An acid such as hydrochloric acid or an alkali such as ammonia is added in order to adjust pH of the solution as a synthesis condition. The pH is preferably not more than 4 or not less than 10. Water may be added to perform the hydrolysis. The amount of water to be added can be 1.5 times or more with respect to metal alkoxide species in the molar ratio.

Examples of solvents of the sol include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive of the sol, it is possible to use polyethylene glycol, polyethylene oxide, hydroxypropylcellulose, and polyvinyl alcohol for viscosity adjustment; alkanolamine such as triethanolamine, β-diketone such as acetylacetone, β-ketoester, formamid, dimetylformamide, and dioxane, and the like, as a solution stabilizer.

The substrate is coated with the sol prepared as described above (step S2 of FIG. 3). From a viewpoint of mass-production, it is preferred that the substrate be coated with the sol (the sol be applied on the substrate) at a predetermined position while a plurality of substrates are continuously transported. As the coating method, it is possible to use any coating method such as a bar coating method, a spin coating method, a spray coating method, a dip coating method, a die coating method, and an ink-jet method. The die coating method, the bar coating method, and the spin coating method are preferable, because the substrate having a relatively large area can be coated uniformly with the sol and the coating can be quickly completed prior to gelation of the sol.

After the coating step, the substrate is dried by being held or kept in the atmosphere or under reduced pressure so as to evaporate the solvent in the coating film (hereinafter also referred to as "sol-gel material layer" as appropriate) (step S3 of FIG. 3). In a case that the holding time of the substrate is short, the viscosity of the coating film is too low to transfer the pattern in the subsequent transfer step. In a case that the holding time of the substrate is too long, the polymerization reaction of the precursor proceeds too much and thus the transfer cannot be performed in the transfer step. In a case that the optical substrate is mass-produced, the holding time can be controlled as a time for transporting the substrate from the sol coating to the subsequent transfer step using the film-shaped mold. A holding temperature of the substrate in the drying step desirably stays constant in a range of 10 to 100 degrees Celsius, and more desirably stays constant in a range of 10 to 30 degrees Celsius. In a case that the holding temperature is higher than this range, the gelation reaction of the coating film proceeds rapidly before the transfer step, which is not preferable. In a case that the holding temperature is lower than this range, the gelation reaction of the coating film proceeds slowly before the transfer step, which reduces the productivity and is not preferable. After the sol coating, the polymerization reaction of the precursor proceeds as the evaporation of the solvent proceeds, and the physical property such as the viscosity of the sol also changes in a short time. The amount of vaporization of the solvent depends also on the amount of the solvent (concentration of the sol) used at the time of preparing the sol. For example, in a case that the sol is the silica precursor solution, the hydrolysis and condensation polymerization reaction of the silica precursor occur as the gelation reaction and alcohol is generated in the sol through dealcoholization reaction. A volatile solvent such as the alcohol is used in the sol as the solvent. That is, the alcohol generated in the hydrolysis process and the alcohol existing as the solvent are included in the sol, and sol-gel reaction proceeds by removing them in the drying step. Therefore, it is desirable that the holding time and holding temperature be adjusted by taking the gelation reaction and the solvent used in the sol into consideration. In the drying step, the solvent in the sol evaporates simply by holding the substrate as it is. Thus, it is not indispensable to actively perform a drying operation such as heating and blowing. Leaving the substrate with the coating film as it is for a predetermined time or transporting said substrate in a predetermined time for subsequent steps are enough for drying the substrate. That is, the drying step is not indispensable for the substrate formation step.

Figure 4:
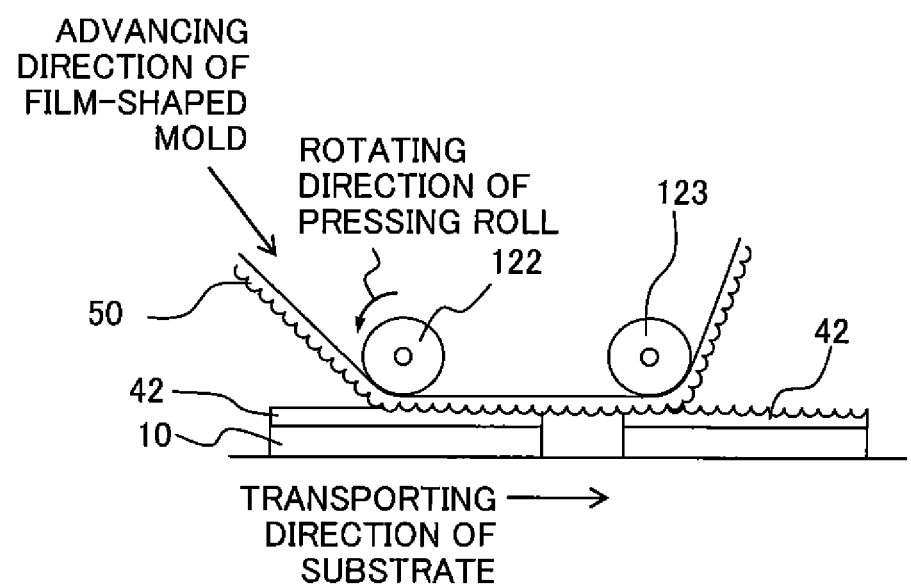
FIG. 4 is a conceptual view depicting a transfer step in FIG. 3.

After the time set as described above has elapsed, a mold having a minute concave-convex pattern is pressed against the coating film to transfer the concave-convex pattern of the mold to the coating film on the substrate (step S4 of FIG. 3). It is desired that a flexible film-shaped mold be used as the mold. For example, as depicted in FIG. 4, it is possible to transfer the concave-convex pattern of a film-shaped mold 50 to a coating film (sol) 42 on the substrate 10 by sending the film-shaped mold 50 between a pressing roll 122 and the substrate 10 being transported immediately below the pressing roll 122. That is, in a case that the film-shaped mold 50 is pressed against the coating film 42 with the pressing roll 122, the surface of the coating film 42 on the substrate 10 is coated (covered) with the film-shaped mold 50 while the film-shaped mold 50 and the substrate 10 are synchronously transported. In this situation, by rotating the pressing roll 122 while pressing the pressing roll 122 against the back surface (surface on the side opposite to the surface in which the concave-convex pattern is formed) of the film-shaped mold 50, the film-shaped mold 50 moves with the substrate 10 to adhere to the substrate 10. In order to send the long film-shaped mold 50 to the pressing roll 122, it is advantageous that the film-shaped mold 50 is fed directly from a film roll around which the long film-shaped mold 50 is wound.

The film-shaped mold used for manufacturing an optical member of the present invention is a film-shaped or sheet-shaped mold having a concave-convex transfer pattern on a surface thereof. The mold is made, for example, of organic materials such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), and polyarylate. The concave-convex pattern may be formed directly in (on) each of the materials, or may be formed in (on) a concave-convex forming material with which a base material (substrate sheet) formed of the above-mentioned materials is coated. It is possible to use photo-curable resin, thermosetting resin, and thermoplastic resin as the concave-convex forming material.

The size of the film-shape mold, in particular, the length thereof can be set appropriately based on the size of the optical substrate to be mass-produced, the number of optical substrates (the number of lots) continuously produced in a single manufacturing process. For example, the film-shaped mold may be a long mold having 10 meter or more in length, and the pattern transfer may be performed continuously on a plurality of substrates while the film-shaped mold wound around a roll is continuously fed from the roll. The film-shaped mold may be 50 mm to 3000 mm in width, and 1 μm to 500 μm in thickness. A surface treatment or an easy-adhesion treatment may be performed to improve an adhesion property between the substrate and the coating film. Further, a mold-release treatment may be performed on each surface of the concave-convex pattern as needed. The concave-convex pattern may be formed to have any profile by arbitrary method.

The film-shaped mold has the following advantages when compared to a mold in a roll shape made of metal and the like. That is, regarding a hard mold made of metal, silica, and the like, in a case that any defect has been found in a concave-convex pattern of the hard mold, it is possible to clean and/or repair the defect. Thus, any failure can be avoided which would be otherwise caused by the transfer of the defect to a so-gel material layer. However, in the film-shaped mold, the cleaning and the repair as described above are less likely to be performed easily. In the meanwhile, the mold made of metal, silica, and the like is in a roll shape, and when any defect such as clogging occurs in the mold, a transfer device is required to be immediately stopped to exchange the mold. On the other hand, since the transfer using the film-shaped mold is performed while each of the parts of the film-shaped mold is made to correspond to each single glass substrate, a part having the defect such as the clogging is marked at an inspection stage, and the transport of the glass substrate can be suspended until the defect part passes through the glass substrate. Therefore, on the whole, the use of the film-shaped mold can reduce the occurrence of defective product and thereby making it possible to improve the throughput. In a case that the concave-convex pattern of the hard mold made of metal, silica, and the like is tried to be directly transferred to the sol-gel material layer, various limitations as described below arise and thus a desired performance cannot be given sufficiently in some cases. For example, in a case that a hard substrate such as glass is used as the substrate on which the sol-gel material layer is formed, the adjustment of the pressure applied to the mold is difficult. For example, if the pressure applied to the mold is high, the substrate is damaged, for example, to have a crack since both of the substrate and the mold are hard; or if the pressure applied to the mold is low, the concave-convex pattern is transferred insufficiently. Therefore, a soft material must be used for the substrate or the mold. Even when the film-shaped mold (soft mold) is used, a material to which the concave-convex pattern is transferred is required to have a superior film shaped mold-releasing property, a superior adhesion property to the substrate, and a superior transferability of the concave-convex pattern.

It is desired that the concave-convex pattern of the film-shaped mold, for example, be an irregular concave-convex pattern in which the pitches of concavities and convexities are ununiform and the orientations of the concavities and convexities have no directivity. The average pitch of the concavities and convexities of the concave-convex pattern can be within a range from 100 nm to 1500 nm, and is more preferably within a range from 200 nm to 1200 nm. The average height of the concavities and convexities of the concave-convex pattern is preferably in a range of 20 nm to 200 nm, and more preferably in a range of 30 nm to 150 nm. The light scattered and/or diffracted by such a concave-convex pattern is not light having single wavelength or wavelength having a narrow band. The light scattered and/or diffracted by such a concave-convex pattern has a range of wavelength relatively broad, has no directivity, and is directed in various directions.

A roll process using the pressing roll as depicted in FIG. 4 has the following advantages as compared with a pressing system: i) the period of time during which the mold and the coating film are brought in contact with each other in the roll process is shorter than that in the pressing system, and thus it is possible to prevent deformation of the pattern caused by the difference among coefficients of thermal expansion of the mold, the substrate, a stage on which the substrate is provided, and the like; ii) productivity is improved by the roll process and the productivity is further improved by use of the long film-shaped mold; iii) it is possible to prevent generation of bubbles of gas in the pattern caused by bumping of the solvent in the gel solution and/or it is possible to prevent a trace or mark of gas from being left; iv) it is possible to reduce transfer pressure and releasing force (peeling force) because of line contact with the substrate (coating film), and thereby making it possible to deal with a larger substrate readily; and v) no bubble is involved during the pressing. Since the flexible film-shaped mold is used as the mold, when the concave-convex pattern of the mold is transferred to the sol-gel material layer 42 formed on the relatively hard substrate 10, the pattern of the mold can be uniformly pressed against the sol-gel material layer formed on the entire surface of the substrate. Accordingly, the concave-convex pattern of the mold can be faithfully transferred to the sol-gel material layer, thereby making it possible to suppress the occurrence of transfer omission and/or transfer failure.

In the transfer step, the film-shaped mold may be pressed against the coating film while the coating film is heated. As the method for heating the coating film, for example, the heating through the pressing roll may be performed, or the coating film may be heated directly or from the side of the substrate. In a case that the heating is performed through the pressing roll, a heating means may be provided in the pressing roll (transfer roll), and any heating means can be used. Although it is preferred that a heater be included in the pressing roll, the heater may be provided separately from the pressing roll. In any case, arbitrary pressing roll may be used provided that the coating film can be pressed while being heated. The pressing roll is preferably a roll of which surface is coated with a resin material with heat resistance, such as ethylene propylene diene rubber (EPDM), silicone rubber, nitrile rubber, fluororubber, acrylic rubber, and chloroprene rubber. A supporting roll may be provided to face the pressing roll while sandwiching the substrate therebetween in order to resist the pressure applied by the pressing roll. Alternatively, a support base supporting the substrate may be provided.

The heating temperature of the coating film at the time of the pressing may be in a range of 40 degrees Celsius to 150 degrees Celsius. In a case that the heating is performed by use of the pressing roll, the heating temperature of the pressing roll may be also in a range of 40 degrees Celsius to 150 degrees Celsius. By heating the pressing roll as described above, the mold can be easily released (peeled off) from the coating film against which the mold has been pressed, and thereby making it possible to improve the productivity. In a case that the heating temperature of the coating film or the pressing roll is less than 40 degrees Celsius, the mold cannot be expected to be released (peeled off) from the coating film quickly. In a case that the heating temperature of the coating film or the pressing roll exceeds 150 degrees Celsius, the solvent used evaporates so rapidly that there is fear that the concave-convex pattern is not transferred sufficiently. By performing the pressing while heating the coating film, an effect similar to that obtained in pre-baking of the sol-gel material layer which will be described later can be expected.

After the mold is pressed against the coating film (sol-gel material layer), the coating film may be subjected to the pre-baking. In a case that the pressing is performed without heating of the coating film, it is preferred that the pre-baking be performed. The pre-baking promotes the gelation of the coating film to solidify the pattern, and thus the pattern is less likely to be collapsed during the releasing. That is, the pre-baking has two roles of the reliable pattern formation and the improvement of releasing property (peeling property) of the mold. In a case that the pre-baking is performed, the heating is preferably performed at temperatures of 40 degrees Celsius to 150 degrees Celsius in the atmosphere.

The mold is released or peeled off from the coating film (sol-gel material layer) after the transfer step or the pre-baking step (step S5 of FIG. 3). Since the roll process is used as described above, the releasing force (peeling force) may be smaller than that of a plate-shaped mold used in the pressing system, and it is possible to easily release the mold from the coating film without the coating film remaining on the mold. In particular, since the pressing is performed while the coating film is heated, the reaction is more likely to progress, which facilitates the releasing of the mold from the coating film immediately after the pressing. In order to promote the releasing property (peeling property) of the mold, it is possible to use a peeling roll (releasing roll). As depicted in FIG. 4, by providing a peeling roll (releasing roll) 123 on the downstream side of the pressing roll 122 and supporting the film-shaped mold 50 while urging the film-shaped mold 50 toward the coating film 42 with the rotating peeling roll 123, a state in which the film-shaped mold 50 is attached to the coating film can be maintained by a distance between the pressing roll 122 and the peeling roll 123 (for a certain period of time). Then, by changing a path of the film-shaped mold 50 such that the film-shaped mold 50 is pulled up above the peeling roll 123 on the downstream side of the peeling roll 123, the film-shaped mold 50 is peeled off (released) from the coating film 42 in which the concavities and convexities are formed. The pre-baking or the heating of the coating film may be performed during a period in which the film-shaped mold 50 is attached to the coating film. In a case that the peeling roll 123 is used, by peeling the coating film from the mold 50 while heating the coating film, for example, to temperatures of 40 degrees Celsius to 150 degrees Celsius, the coating film can be peeled more easily.

After the mold is released (peeled off) from the coating film (sol-gel material layer) 42 on the substrate 10, the coating film is subjected to the main baking (step S6 of FIG. 3). Hydroxyl group and the like contained in the layer of sol-gel material such as silica, which forms the coating film, is desorbed or eliminated by the main baking to further harden (solidify) the coating film. It is preferred that the main baking be performed at temperatures of 200 degrees Celsius to 1200 degrees Celsius for about 5 minutes to 6 hours. Accordingly, the coating film is cured, and thus the substrate 10 with the concave-convex pattern layer 12 which corresponds to the concave-convex pattern of the film-shaped mold is obtained. In this situation, in a case that the sol-gel material layer is made of the silica, depending on the baking temperature and the baking time, the silica is amorphous, crystalline, or in a mixture state of the amorphous and the crystalline.

[Auxiliary Layer]

The auxiliary layer 14 is formed on the concave-convex pattern layer 12. The auxiliary layer 14 makes the concave-convex pattern on the surface of the concave-convex pattern layer 12 smooth or gentle (shallow waves) to prevent the occurrence of a leak current which would be otherwise caused in the first electrode layer 16 formed on the auxiliary layer 14. The experiment performed by the inventors of the present invention has shown that, in a case that the auxiliary layer 14 is formed to have no concave-convex pattern on the surface on the side of the first electrode 16 (hereinafter referred to as the surface of the auxiliary layer 14 as appropriate); in other words, in a case that the surface of the auxiliary layer 14 is formed to be flat surface, the light extraction efficiency is reduced instead of being improved as compared with the case in which the auxiliary layer 14 has the concave-convex pattern on the surface. The reason thereof is assumed by the inventors as follows. That is, in a case that the surface of the auxiliary layer 14 is flat, the first electrode 16, the organic layer 18, and the second electrode 20 are also flat. This causes the light, which comes from the organic layer 18 to arrive at the second electrode 20, to be absorbed by free electron of the second electrode 20, which is so-called plasmon absorption. For this reason, the concave-convex shape on the surface of the auxiliary layer 14 is required to be controlled to have a concave-convex shape in which the depths of concavities and convexities are not deeper than those of the concave-convex pattern layer 12 but they are not flat. In the present invention, in order to express the concave-convex shape on the surface of the auxiliary layer 14, i.e., the degree of concavities and convexities (depths), there is used the change ratio of the standard deviation of depths of concavities and convexities (hereinafter referred to as "second concave-convex depth" as appropriate) of the concave-convex shape on the surface of the auxiliary layer 14 on the side opposite to the substrate 10 (hereinafter referred to as "second concave-convex shape as appropriate") with respect to the standard deviation of depths of concavities and convexities (hereinafter referred to as "first concave-convex depth" as appropriate) of the concave-convex shape on the surface of the concave-convex pattern layer 12 (hereinafter referred to as "first concave-convex shape as appropriate). This change ratio is appropriately referred as "shape change ratio" in this context. That is, the shape change ratio W is represented by the following formula:

$$W = (\sigma_1 - \sigma_2)/\sigma_1$$

in the formula, $\sigma_1$ is the standard deviation of the first concave-convex depth and $\sigma_2$ is the standard deviation of the second concave-convex depth.

In the present invention, it is desired that the shape change ratio be 70% or less, and especially it is desired that the shape change ratio be in a range of 20% to 70%. In a case that the auxiliary layer has the second concave-convex shape (waves), each surface of the first electrode layer 16 and the organic layer 18 to be stacked on the auxiliary layer 14 has a concave-convex shape which follows the second concave-convex shape. Thus, the diffraction grating effect similar to that obtained in the concave-convex pattern layer 12 is more likely to be obtained at the boundaries between respective layers. However, in a case that the shape change ratio is too small, the second concave-convex shape resembles the first concave-convex shape and thus, it is assumed that a leak current is more likely to occur due to conspicuous projections formed especially on the first electrode 16. Therefore, it is preferred that the shape change ratio be 20% or more. On the other hand, in a case that the shape change ratio is high, that is, in a case that the surface of the auxiliary layer 14 is smooth or planarized, the occurrence of the leak current is easily prevented, but the plasmon absorption on the surface of the second electrode is more likely to occur due to the reflection from the surface of the auxiliary layer 14, and as a result, the light extraction efficiency is reduced. Therefore, the surface shape of the auxiliary layer 14 is controlled so that the shape change ratio is 70% or less. Further, as to the concave-convex shape on the surface of the auxiliary layer 14 itself, it is assumed that the plasmon absorption is more likely to occur when the standard deviation of the second concave-convex depth is less than 2.5 nm.

The film thickness of the auxiliary layer 14 has an influence also on multiple interference caused in the stacked structure of the organic EL element. Thus, the thickness of the auxiliary layer 14 can be adjusted appropriately to optimize or shift the position of peak wavelength of the light extracted from the substrate.

It is preferred that the auxiliary layer 14 be made of inorganic materials such as $TiO_2$, $ZnO$, $ZnS$, $ZrO$, $BaTiO_3$, and $SrTiO_2$. Of the above materials, $TiO_2$ is preferable in view of film formation performance and refractive index. The auxiliary layer 14 can be formed by any method. It is possible to use a method of coating the concave-convex pattern layer 12 with the solution of the sol-gel material and making the solution turn into a gel, a method of coating the concave-convex pattern layer 12 with a dispersion liquid of inorganic fine particles and drying the coating film, a liquid phase deposition (LPD), and the like. In a case that a $TiO_2$ dispersion liquid is used, the sizes of $TiO_2$ fine particles cannot have sizes smaller than 10 nm and further $TiO_2$ fine particles are more likely to be a secondary aggregate, which cannot be disintegrated completely. As a result, the surface roughness of the auxiliary layer 14 exceeds 5 nm, which causes a leak current easily. Therefore, it is preferred that a sol-gel method be used, in which method the sol-gel solution containing titanium alkoxide and/or an organic compound is applied by spin coating or the like and the applied sol-gel solution is allowed to turn into a gel by being dried and heated.

[First Electrode]

The first electrode 16 is formed on the auxiliary layer 14. The first electrode 16 has a transmissive ability or permeability to allow the light from the organic layer 18 formed on the first electrode 16 to pass toward the substrate side. Therefore, the first electrode 16 is also referred to as a transparent electrode. As the electrode material of the first electrode 16, for example, indium oxide, zinc oxide, tin oxide, indium-tin oxide (ITO) which is a composite material thereof, gold, platinum, silver, or copper can be used. Of these materials, ITO is preferable from the viewpoint of transparency and electrical conductivity.

As the method for forming the first electrode 16, any known method such as a vapor deposition method, a sputtering method, a CVD method, and a spray method can be employed as appropriate. Of these methods, the sputtering method is preferably employed from the viewpoint of improving the adhesion property. After forming the film of an electrode material layer by the sputter method or the like, a desired electrode pattern can be formed by a photolithography process (photoetching method).

The first electrode 16 may have an actual film thickness ranging from 80 nm to 200 nm or an optical film thickness ranging from 160 nm to 400 nm. In the present invention, in a case that the thickness is less than the lower limit, the electrical conductivity is more likely to be insufficient. In a case that the thickness exceeds the upper limit, there is possibility that the transparency is so insufficient that the emitted light (EL light) is more likely to stationary stand in the first electrode 16 and the auxiliary layer 14, which causes the deterioration of the light extraction efficiency. Especially, in a case that the value of refractive index of the auxiliary layer 14 is close to the value of refractive index of the first electrode 16 and that the total film thickness of the auxiliary layer 14 and the first electrode 16 is not less than a predetermined thickness, the emitted light is more likely to stationary stand in the two layers. According to the results of Examples which will be described later, etc., it is desired that the total optical film thickness (the total film thicknesses expressed in optical path length) of the auxiliary layer and the first electrode be in a range of 160 nm to 400 nm. Normally, a film thickness which allows the light to stationary stand in the film is supposed to be $\lambda/4$. This has a slight influence on the above range, because the light-emission central wavelength of the organic EL element is about 600 nm. In a case that the total optical film thickness exceeds 400 nm, the emitted light is more likely to stationary stand in the two layers, which causes the deterioration of the light extraction efficiency. Further, any structural defect such as a crack in any of the layers is more likely to occur. In a case that the total optical film thickness is less than 160 nm, foreign matters and defects such as a recess or depression generated on the concave-convex pattern layer cannot be repaired by those layers, and thus a leak current is more likely to occur. It is preferred that the total optical film thickness be in a range of 160 nm to 250 nm. Similar to the auxiliary layer 14, the film thickness of the first electrode layer 16 has an influence also on the multiple interference caused in the stacked structure of the organic EL element. Thus, in order to optimize the position of peak wavelength of the light extracted from the substrate, the thickness of the first electrode layer 16 may be adjusted together with or independently from the auxiliary layer 14. In the present description, the thickness means the actual film thickness unless noted as the optical film thickness.

In the present invention, in a case that the substrate 10 is made from glass material and that silica-based sol-gel material is used for forming the concave-convex pattern layer (concave-convex forming layer) 12, it is desired that the following relation between the refractive index of the first electrode layer 16, the refractive index of the auxiliary layer 14, the refractive index of the concave-convex forming layer 12, and the refractive index of the substrate 10 be satisfied. Assuming that the refractive indexes of the substrate 10, the concave-convex forming layer 12, the auxiliary layer 14, and the first electrode layer 16 are n0, n1, n2, and n3, respectively, $n2 \geq n3 > n1 \leq n0$ is satisfied. Further, in order to prevent the total reflection at the interface between the concave-convex pattern layer and the substrate, it is preferred that $0 \leq n1-n0 \leq 0.1$ be satisfied. In a case that the first electrode layer 16 is formed while the substrate is heated to have a temperature of 200 degrees Celsius or more, the refractive index ($\lambda=550$ nm) of the first electrode layer 16 is in a range of 1.8 to 1.9. In a case that the first electrode layer 16 is formed while the substrate has room temperature, the refractive index ($\lambda=550$ nm) of the first electrode layer 16 is in a range of 2.0 to 2.1. In any of the cases, the value of the refractive index of the auxiliary layer 14 is greater than the value of the refractive index of the first electrode layer 16.

[Organic Layer]

The organic layer 18 is not particularly limited, provided that the organic layer 18 is usable as an organic layer of the organic EL element. As the organic layer 18, any known organic layer can be used as appropriate. The organic layer 18 may be a stacked body of various organic thin films. For example, the organic layer 18 may be a stacked body of a hole transporting layer, a light-emitting layer, and an electron transporting layer. Examples of materials of the hole transporting layer include aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl($\alpha$-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino)triphenylamine (m-MTDATA). The materials of the hole transporting layer, however, are not limited thereto.

By providing the light emitting layer, a hole injected from the first electrode 16 and electron injected from the second electrode 20 are recombined to occur light emission. Examples of materials of the light emitting layer include metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Further, it is preferred that light-emitting materials selected from the above compounds be mixed as appropriate and then used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium. A host material having high carrier mobility may be doped with each of the light-emitting materials as a guest material to generate the light emission using dipole-dipole interaction (Forster mechanism), or electron exchange interaction (Dexter mechanism). Examples of materials of the electron transporting layer include heterocyclic tetracarboxylic anhydrides such as nitro-substituted fluorene derivatives, diphenylquinone derivatives, thiopyran dioxide derivatives, and naphthaleneperylene; and metallo-organic complex such as carbodiimide, fluorenylidene methane derivatives, anthraquino dimethane and anthrone derivarives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms and quinoxaline derivatives having quinoxaline rings known as electron attractive group.

Furthermore, it is also possible to use a polymeric material in which the above materials are introduced into a macromolecular chain or the above materials are made to be a main chain of the macromolecular chain. It is noted that the hole transporting layer or the electron transporting layer may also function as the light-emitting layer. In this case, there are two organic layers 18 between the first electrode 16 and the second electrode 20.

From the viewpoint of facilitating the electron injection from the second electrode 20, it is allowable to provide, between the organic layer 18 and the second electrode 20, as an electron injecting layer, a layer made of a metal fluoride such as lithium fluoride (LiF), a metal oxide such as $Li_2O_3$, a highly active alkaline earth metal such as Ca, Ba, or Cs, an organic insulating material, or the like. Further, from the viewpoint of facilitating the hole injection from the first electrode 16, it is allowable to provide, between the organic layer 18 and the first electrode 16, as the hole injecting layer, a layer made of triazole derivatives; oxadiazole derivatives; imidazole derivatives; polyarylalkane derivatives; pyrazoline derivatives and pyrazolone derivatives; phenylenediamine derivatives; arylamine derivatives; amino-substituted chalcone derivatives; oxazole derivatives; styrylanthracene derivatives; fluorenon derivatives; hydrazone derivatives; stilbene derivatives; silazane derivatives; aniline copolymer; or a conductive polymer oligomer, in particular, thiophene oligomer, or the like.

In a case that the organic layer 18 is a stacked body formed of the hole transporting layer, the light-emitting layer, and the electron transporting layer, the thicknesses of the hole transporting layer, the light-emitting layer, and the electron transporting layer are preferably in a range of 1 nm to 200 nm, in a range of 5 nm to 100 nm, and in a range of 5 nm to 200 nm, respectively. As a method for stacking the organic layer 18, any known method such as a vapor deposition method, a sputtering method, a spin coating method, and a die coating method can be employed as appropriate.

[Second Electrode]

The second electrode 20 as a metal electrode is provided on the organic layer 18. Materials of the second electrode 20 are not particularly limited, and a substance having a small work function can be used as appropriate. Examples of the materials of the second electrode 20 include aluminum, MgAg, MgIn, and AlLi. The thickness of the second electrode 20 is preferably in a range of 50 nm to 500 nm. In a case that the thickness is less than the lower limit, the electrical conductivity is more likely to be decreased. In a case that the thickness exceeds the upper limit, there is possibility that the repair or restoration is difficult when a short circuit between electrodes occurs. Any known method such as a vapor deposition method and a sputtering method can be adopted to stack the second electrode 20. Accordingly, an organic EL element 30 having the structure as depicted in FIG. 1 can be obtained.

Since the second electrode 20 is the metal electrode, a polarizing plate may be put on the second electrode 20 in order to take a measure against specular reflection of the metal electrode. Further, it is allowable to seal the periphery of the organic EL element 30 with a sealing material to prevent deterioration of the organic EL element 30 due to moisture and/or oxygen.

Figure 2:
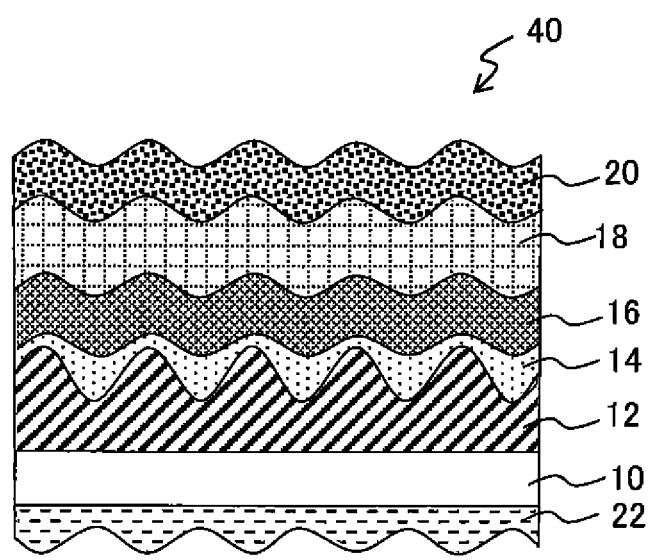
FIG. 2 is a schematic cross-sectional view depicting a cross-section structure of an organic EL element of another aspect of the present invention.

FIG. 2 depicts another embodiment of the organic EL element of the present invention. An organic EL element 40 includes a lens layer 22 on the outer surface of the substrate 10 of the organic EL element depicted in FIG. 1. By providing such a lens layer 22, the light passing through the substrate 10 is prevented from being totally reflected at the interface between the substrate 10 (including the lens layer 22) and air, which makes it possible to improve the light extraction efficiency. As the lens layer 22, it is possible to adopt, for example, a hemispherical lens and a lens having corrugated structure. The lens layer 22 is not particularly limited, provided that the lens layer 22 is usable for extraction of the light of the organic EL element. Any optical member having a structure capable of extracting the light to the outside of the element can be used as the lens layer 22. As the lens layer 22, various lens members, a diffusion sheet or plate made of a transparent body into which diffusion material is blended and the like may be used. The various lens members include a convex lens such as the hemispherical lens, a concave lens, a prism lens, a cylindrical lens, a lenticular lens, a microlens formed of a concave-convex layer which can be formed by the method similar to a method for manufacturing a diffraction grating substrate as will be described later, and the like. Of the above examples, the lens member is preferably used because the light can be extracted efficiently. Further, a plurality of lens members may be used as the lens layer 22. In this case, a so-called microlens (array) may be formed by arranging or arraying fine or minute lens members. A commercially available product may be used for the lens layer 22.

In a case that the microlens formed of the concave-convex layer which can be formed by the method similar to the method for manufacturing the diffraction grating substrate is used as the lens layer 22, and that a Fourier-transformed image is obtained by performing a two-dimensional fast Fourier-transform processing on an concavity and convexity analysis image obtained by analyzing the concave-convex shape of the concave-convex layer of the microlens with an atomic force microscope, it is preferred that the Fourier-transformed image have a shape showing a circular or annular pattern substantially centered at an origin at which an absolute value of wavenumber is 0 $\mu m^{-1}$. As for the microlens formed of such a concave-convex layer, the concave-convex shape is isotropic as viewed from various cross-sectional directions. Thus, in a case that the light is allowed to enter from the side of one surface (surface in contact with the substrate) and that the light is extracted from the surface in which the concave-convex shape is formed, it is possible to sufficiently reduce the angle dependence of the extracted light (the angle dependence of luminance) and the change in chromaticity.

Further, in the case that the microlens formed of the concave-convex layer is used as the lens layer 22, it is preferred that the Fourier-transformed image obtained from the concave-convex shape be present within a region where the absolute value of wavenumber is in a range of 1 $\mu m^{-1}$ or less. In a case that such a Fourier-transformed image satisfies the above requirement, it is possible to sufficiently reduce the angle dependence of the extracted light and the change in chromaticity at a higher level. Further, it is preferred that the circular or annular pattern of the Fourier-transformed image be present within a region where the absolute value of wavenumber is in a range of 0.05 $\mu m^{-1}$ to 1 $\mu m^{-1}$, from the viewpoint of refracting or diffracting a light spectrum in a visible region (380 nm to 780 nm) efficiently. It is further preferred that the circular or annular pattern of the Fourier-transformed image be present within a region where the absolute value of wavenumber is in a range of 0.1 $\mu m^{-1}$ to 0.5 $\mu m^{-1}$. In a case that the circular or annular pattern is not present in the region where the absolute value of wavenumber is in the above range, that is, in a case that the number of bright spots, of the bright spots forming the Fourier-transformed image showing the circular or annular pattern, which are present in the above range, is less than 30%, refraction sufficient for use as a lens for extracting the light is less likely to be obtained. Further, it is further preferred that the pattern of the Fourier-transformed image be the annular pattern from the viewpoint of obtaining satisfactory effect for the light having wavelengths in the visible region (380 nm to 780 nm).

In the case that the microlens formed of the concave-convex layer is used as the lens layer 22, the average pitch of concavities and convexities of the microlens is preferably in a range of 2 μm to 10 μm, and more preferably in a range of 2.5 μm to 5 μm. In a case that the average pitch of the concavities and convexities is less than the lower limit, the diffraction effect as the diffraction grating is greater than the refraction effect for extracting the light of the optical member to the outside. This reduces the light extraction effect and increases the angle dependence of the extracted light, and as a result, enough light extraction is less likely to be obtained depending on the measurement position. On the other hand, in a case that the average pitch of the concavities and convexities exceeds the upper limit, the diffraction effect is less likely to be obtained and the characteristics of the microlens are liable to be similar to the characteristics of a normal hemispherical lens. The average height of concavities and convexities of the microlens is preferably in a range of 400 nm to 1000 nm, more preferably in a range of 600 nm to 1000 nm, and further preferably in a range of 700 nm to 900 nm. In a case that the average height (depth) of the concavities and convexities is less than the lower limit, the sufficient refraction effect or diffraction effect is less likely to be obtained. On the other hand, in a case that the average height (depth) of the concavities and convexities exceeds the upper limit, mechanical strength is more likely to be reduced, which could cause a crack easily at the time of manufacture and/or at the time of use. The microlens formed of the concave-convex layer can be formed by adopting the method for manufacturing the diffraction grating substrate as will be described later, appropriately changing the conditions and the like for forming a master block, and appropriately adjusting the characteristics (size and the like) of the concave-convex shape.

As the lens layer 22 for extracting the light to the outside, those having various sizes and shapes can be used depending on the use, the size, the structure, and the like of the organic EL element. From the viewpoint of preventing the reflection at the interface between air and the surface of the lens layer 22 (the structure for extracting the light to the outside), it is preferred that the microlens formed of the hemispherical lens and the concave-convex layer which can be formed by the method similar to the method for manufacturing the diffraction grating substrate as will be described later, be used. In a case that the thickness of the organic EL element considered to be unimportant (in a case that there is no problem with a thick organic EL element), it is preferred that the hemispherical lens be used. In a case that the thickness of the organic EL element is considered to be important (in a case that a thinner organic EL element is preferred), it is preferred that the microlens formed of the concave-convex layer be used. In a case that the microlens formed of the concave-convex layer, which can be formed by the method similar to the method for manufacturing the diffraction grating substrate, is used, the concave-convex shape is isotropic as viewed from various cross-sectional directions. Thus, in a case that the light is allowed to enter from the side of one surface (surface in contact with the substrate) and that the light is extracted from the surface in which the concave-convex shape is formed, it is possible to sufficiently reduce the angle dependence of the extracted light (the angle dependence of luminance) and the change in chromaticity.

The hemispherical lens suitable as the lens layer 22 is preferably a hemispherical lens having the area of the bottom surface 1 to 10 times larger than the light emission area of the organic EL element. That is, in the case that the hemispherical lens is used, it is preferred that the semispherical lens having the area of the bottom surface 1 to 10 times larger than the area of one pixel which is the light emission area of the organic EL element be used to completely cover the one pixel which is the light emission area of the organic EL element with the bottom surface of the hemispherical lens. In a case that the area of the bottom surface of the hemispherical lens is less than the lower limit, the component, of the light emitted at the organic EL element, coming into a spherical surface of the hemispherical lens from an oblique direction is more likely to increase. On the other hand, in a case that the area of the bottom surface of the hemispherical lens exceeds the upper limit, the size of the organic EL element is too big and the hemispherical lens is liable to be expensive.

The material of the lens layer 22 is not particularly limited, an optical member made of any material can be used. It is possible to use, for example, transparent inorganic materials such as glass and transparent resin materials made of transparent polymers and the like, the transparent resin materials including polyester resin such as polyethylene terephthalate and the like, cellulose resin, acetate resin, polyethersulfone resin, polycarbonate resin, polyamide resin, polyimide resin, polyolefin resin, and acrylic resin. Further, in order to prevent the reflection at the interface between the organic EL element and the lens layer 22, it is preferred that the lens layer 22 be stacked on the substrate 10 via a pressure-sensitive adhesive layer and/or an adhesive layer to prevent air from being sandwiched between the organic EL element and the lens layer 22.

As for the lens layer 22, a protective layer may be stacked on the surface of the optical member (on the surface in which the concave-convex shape is formed, when the microlens formed of the concave-convex layer is used as the lens layer 22) from the viewpoint of improving wear resistance and scratch resistance of the surface thereof. It is possible to use a transparent film or a transparent inorganic deposited layer as the protective layer. The transparent film is not particularly limited, and any transparent film can be used. Examples of the transparent film include films made of transparent polymers such as polyester resin including polyethylene terephthalate and the like, cellulose resin, acetate resin, polyethersulfone resin, polycarbonate resin, polyamide resin, polyimide resin, polyolefin resin, and acrylic resin. Further, the transparent film may be used as follows. That is, the pressure-sensitive adhesive layer or the adhesive layer is formed on one surface of the transparent film, and the transparent film with the pressure-sensitive adhesive layer or the adhesive layer is put on the surface of the optical member. (Note that the transparent film may be put on the surface of the lens layer 22 so as to leave a space formed between the adjacent convex portions in a case that the microlens formed of the concave-convex layer is used as the lens layer 22.) As the pressure-sensitive adhesive or the adhesive agent, it is possible to use, for example, acrylic adhesive, polyurethane adhesive, and polyester adhesive, ethylene-vinyl acetate copolymer, natural rubber adhesive, synthetic rubber pressure-sensitive adhesive such as polyisobutylene, butyl rubber, styrene-butylene-styrene copolymer, and styrene-isoprene-styrene block copolymer.

In a case that the inorganic deposited layer is stacked as the protective layer, it is possible to appropriately use any known metallic material which can form a transparent inorganic layer by an evaporation method. Examples of the metallic material include oxide, nitride and sulfide of metal such as Sn, In, Te, Ti, Fe, Co, Zn, Ge, Pb, Cd, Bi, Se, Ga, and Rb. From the viewpoint of sufficiently preventing the deterioration caused by oxidation, it is preferred that $TiO_2$ be used as the metallic material. From the viewpoint of obtaining high luminance at a low cost, it is preferred that ZnS be used as the metallic material. The method for forming the inorganic deposited layer is not particularly limited, and it is possible to manufacture the inorganic deposited layer by using any physical vapor deposition equipment as appropriate.

In the following description, the organic EL element of the present invention will be specifically explained with examples. The present invention, however, is not limited to the following examples.

EXAMPLES

Example 1

In this example, a diffraction grating substrate (substrate provided with a concave-convex pattern layer) is manufactured, and then an organic EL element is manufactured by use of the diffraction grating substrate. At first, a diffraction grating mold having a concave-convex surface is manufactured by the BCP method in order to manufacture the diffraction grating substrate.

<Manufacture of Diffraction Grating Mold>

There was prepared a block copolymer produced by Polymer Source Inc., which was made of polystyrene (hereinafter referred to as "PS" in an abbreviated manner as appropriate) and polymethyl methacrylate (hereinafter referred to as "PMMA" in an abbreviated manner as appropriate) as described below.

Mn of PS segment=750,000
Mn of PMMA segment=720,000
Mn of block copolymer=1,470,000
Volume ratio between PS segment and PMMA segment (PS:PMMA)=54:46
Molecular weight distribution (Mw/Mn)=1.21
Tg of PS segment=107 degrees Celsius
Tg of PMMA segment=134 degrees Celsius The volume ratio of the first polymer segment and the second polymer segment (first polymer segment second polymer segment) in each block copolymer was calculated on the assumption that the density of polystyrene was 1.05 g/cm$^3$, the density of polymethyl methacrylate was 1.19 g/cm$^3$. The number average molecular weights (Mn) and the weight average molecular weights (Mw) of polymer segments or polymers were measured by using gel permeation chromatography (Model No: "GPC-8020" manufactured by Tosoh Corporation, in which TSK-GEL SuperH1000, SuperH2000, SuperH3000, and SuperH4000 were connected in series). The glass transition temperatures (Tg) of polymer segments were measured by use of a differential scanning calorimeter (manufactured by Perkin-Elmer under the product name of "DSC7"), while the temperature was raised at a rate of temperature rise of 20 degrees Celsius/min over a temperature range of 0 degrees Celsius to 200 degrees Celsius. The solubility parameters of polystyrene and polymethyl methacrylate were 9.0 and 9.3, respectively (see Kagaku Binran Ouyou Hen (Handbook of Chemistry, Applied Chemistry), 2nd edition, revised).

Toluene was added to 150 mg of the block copolymer and 37.5 mg of Polyethylene Glycol 2050 (average Mn=2050) manufactured by Sigma-Aldrich Co. LLC. as polyethylene oxide so that the total amount thereof was 15 g, followed by dissolving them. Accordingly, a solution of the block copolymer was prepared.

The solution of the block copolymer was filtrated or filtered through a membrane filter having a pore diameter of 0.5 μm to obtain a block copolymer solution. A glass substrate was coated with the mixed solution, which was obtained by mixing 1 g of KBM-5103 produced by Shin-Etsu Chemical Co., Ltd., 1 g of ion-exchanged water, 0.1 ml of acetic acid, and 19 g of isopropyl alcohol, by spin coating (the spin coating was performed at a spin speed of 500 rpm for 10 seconds, and then performed at a spin speed of 800 rpm for 45 seconds). The grass substrate was subjected to treatment at a temperature of 130 degrees Celsius for 15 minutes to obtain a silane coupling treated glass. The silane coupling treated glass as a base member was coated with the obtained block copolymer solution by spin coating to form a thin film having a thickness of 150 nm to 170 nm. The spin coating was performed at a spin speed of 200 rpm for 10 seconds, and then performed at a spin speed of 300 rpm for 30 seconds.

Subsequently, the base material having the thin film formed thereon was subjected to a solvent annealing process by being stationarily placed in a desiccator filled with chloroform vapor at room temperature for 24 hours. In the desiccator (5 liters capacity), a screw vial filled with 100 g of chloroform was placed and the atmosphere in the desiccator was filled with the chloroform at a saturated vapor pressure. Concavities and convexities were observed on the surface of the thin film after the solvent annealing process, and it was found out that micro phase separation of the block copolymer forming the thin film was caused. The observation of the cross-section of the thin film with the transmission electron microscope (TEM) (produced by Hitachi, Ltd., product name: H-710FA) showed that the circular cross-sections of PS portions were aligned to form two tiers (stages) in a direction (height direction) perpendicular to the surface of the substrate while being separated from each other in a direction parallel to the surface of the substrate. Considering the cross-section of the thin film together with the analysis image of the atomic force microscope, it was found out that the phase of each PS portion was separated from the PMMA portion to have a horizontal cylinder structure. The state of phase separation was such that each PS portion was a core (island) surrounded by the PMMA portion (sea).

A thin nickel layer of about 20 nm was formed as a current seed layer by sputtering on the surface of the thin film, for which the solvent annealing process had been performed to allow the thin film to have the wave shape. Subsequently, the base member with the thin film was subjected to an electroforming process (maximum current density: 0.05 A/cm$^2$) in a nickel sulfamate bath at a temperature of 50 degrees Celsius to precipitate nickel until the thickness of nickel became 250 μm. The base member with the thin film was mechanically peeled off from the nickel electroforming body obtained as described above. Then, the nickel electroforming body was immersed in tetrahydrofuran solvent for 2 hours. Thereafter, polymer component(s) adhering to a part of the surface of the electroforming body was (were) removed by repeating the following process three times. That is, the nickel electroforming body was coated with an acrylic-based UV curable resin; and the acrylic-based UV curable resin coating the nickel electroforming body was cured; and then the cured resin was peeled off. Subsequently, the nickel electroforming body was immersed in Chemisol 2303 manufactured by The Japan Cee-Bee Chemical Co., Ltd., followed by being cleaned while being stirred for 2 hours at 50 degrees Celsius. Then, the nickel electroforming body was subjected to a UV-ozone process for 10 minutes.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained.

Subsequently, a PET substrate (manufactured by Toyobo Co., Ltd., product name: COSMOSHINE A-4100) was coated with a fluorine-based UV curable resin. Then, the fluorine-based UV curable resin was cured by irradiation with ultraviolet rays at 600 mJ/cm², with the obtained nickel mold being pressed against the PET substrate. After curing of the resin, the nickel mold was peeled off from the cured resin. Accordingly, a diffraction grating made of the PET substrate with the resin film to which the surface profile of the nickel mold was transferred was obtained.

<Manufacture of Diffraction Grating Substrate>

2.5 g of tetraethoxysilane (TEOS) and 2.1 g of methyltriethoxysilane (MTES) were added by drops to a mixture of 24.3 g of ethanol, 2.16 g of water, and 0.0094 g of concentrated hydrochloric acid, followed by being stirred for 2 hours at a temperature of 23 degrees Celsius and humidity of 45% to obtain a sol. The sol was applied on a soda-lime glass plate (refractive index n=1.52 ($\lambda$=550 nm)) of 15×15×0.11 cm by bar coating. Doctor Blade (manufactured by Yoshimitsu Seiki Co., Ltd.) was used as a bar coater. The doctor blade was designed so that the film thickness of the coating film was 5 µm. However, the doctor blade was adjusted so that the film thickness of the coating film was 40 µm by sticking an imide tape having a thickness of 35 µm to the doctor blade. After the elapse of 60 seconds from the sol coating, the diffraction grating mold manufactured as described above was pressed against the coating film on the glass plate by use of the pressing roll heated to 80 degrees Celsius while the pressing roll was moved and rotated. After the completion of pressing against the coating film, the mold was manually peeled off (released) from the coating film on the glass plate and the coating film on the glass plate was subjected to the main baking by being heated for 60 minutes in an oven of 300 degrees Celsius. Accordingly, it was obtained the substrate having the concave-convex pattern layer in which the pattern of the diffraction grating mold was transferred to the sol-gel material, that is, the diffraction grating substrate. As the pressing roll, it was used a roll which included a heater therein and had the outer periphery covered with heat-resistant silicon of a thickness of 4 mm, the roll having a diameter ($\phi$) of 50 mm and a length of 350 mm in an axial direction of the shaft.

An analysis image of the shape of the concavities and convexities on the surface of the concave-convex pattern layer of the diffraction grating substrate was obtained by use of an atomic force microscope (a scanning probe microscope equipped with an environment control unit "Nanonavi II Station/E-sweep" manufactured by Hitachi High-Tech Science Corporation). Analysis conditions of the atomic force microscope were as follows.

Measurement mode: dynamic force mode
Cantilever: SI-DF40 (material: Si, lever width: 40 µm, diameter of tip of chip: 10 nm)
Measurement atmosphere: in air
Measurement temperature: 25 degrees Celsius A concavity and convexity analysis image was obtained as described above by performing a measurement in a randomly selected measuring region of 3 µm square (length: 3 µm, width: 3 µm) in the diffraction grating substrate. Distances between randomly selected concave portions and convex portions in the depth direction were measured at 100 points or more in the concavity and convexity analysis image, and the average of the distances was calculated as the average height (depth) of the concavities and convexities. The average height of the concave-convex pattern obtained by the analysis image in this example was 56 nm.

A concavity and convexity analysis image was obtained as described above by performing a measurement in a randomly selected measuring region of 3 µm square (length: 3 µm, width: 3 µm) in the diffraction grating substrate. The obtained concavity and convexity analysis image was subjected to a flattening process including primary inclination correction, and then subjected to two-dimensional fast Fourier transform processing. Thus, a Fourier-transformed image was obtained. It was confirmed that the Fourier-transformed image showed a circular pattern substantially centered at an origin at which an absolute value of wavenumber was 0 $\mu m^{-1}$, and that the circular pattern was present within a region where the absolute value of wavenumber was in a range of 10 $\mu m^{-1}$ or less.

The circular pattern of the Fourier-transformed image is a pattern observed due to gathering of bright spots in the Fourier-transformed image. The term "circular" herein means that the pattern of the gathering of the bright spots looks like a substantially circular shape, and is a concept further including a case where a part of a contour looks like a convex shape or a concave shape. The pattern of the gathering of the bright spots may look like a substantially annular shape, and this case is expressed as the term "annular". It is noted that the term "annular" is a concept further including a case where a shape of an outer circle or inner circle of the ring looks like a substantially circular shape and a case where a part of the contour of the outer circle or the inner circle of the ring looks like a convex shape or a concave shape. Further, the phrase "the circular or annular pattern is present within a region where an absolute value of wavenumber is in a range of 10 $\mu m^{-1}$ or less (more preferably 1.25 to 10 $\mu m^{-1}$, further preferably 1.25 to 5 $\mu m^{-1}$)" means that 30% or more (more preferably 50% or more, further more preferably 80% or more, and particularly preferably 90% or more) of bright spots forming the Fourier-transformed image are present within a region where the absolute value of wavenumber is in a range of 10 $\mu m^{-1}$ or less (more preferably 1.25 to 10 $\mu m^{-1}$, and further preferably 1.25 to 5 $\mu m^{-1}$). Regarding the relationship between the pattern of the concave-convex structure and the Fourier-transformed image, the followings have been appreciated. That is, in a case that the concave-convex structure itself has neither the pitch distribution nor the directivity, the Fourier-transformed image appears to have a random pattern (no pattern). In a case that the concave-convex structure is entirely isotropic in an XY direction and has the pitch distribution, a circular or annular Fourier-transformed image appears. In a case that the concave-convex structure has a single pitch, the annular shape appeared in the Fourier-transformed image tends to be sharp.

The two-dimensional fast Fourier transform processing on the concavity and convexity analysis image can be easily performed by electronic image processing by use of a computer equipped with software for the two-dimensional fast Fourier transform processing.

<Average Pitch of Concavities and Convexities>

A concavity and convexity analysis image was obtained as described above by performing a measurement in a randomly selected measuring region of 3 µm square (length: 3 µm, width: 3 µm) in the diffraction grating. Distances between randomly selected adjacent convex portions or between randomly selected adjacent concave portions were measured at 100 points or more in the concavity and convexity analysis image, and the average of the distances was calculated as the average pitch of the concavities and convexities. The average pitch of the concavities and convexities of the concave-convex pattern layer calculated using the analysis image obtained in this example was 73.5 nm.

<Average Value of Depth Distribution of Concavities and Convexities>

A concavity and convexity analysis image was obtained by performing a measurement in a randomly selected measuring region of 3 μm square (length: 3 μm, width: 3 μm) in the concave-convex layer. Here, data of each of the heights of the concavities and convexities was determined at 16384 (128 columns×128 rows) or more measuring points in the measuring region on the nanometer scale. By using E-sweep in this example, a measurement at 65536 points (256 columns×256 rows) (a measurement with a resolution of 256 pixels×256 pixels) was conducted in a measuring region of 3 μm square. Regarding the thus measured heights (unit: nm) of the concavities and convexities, first, a measuring point P which had the largest height from the surface of the substrate among all the measuring points was determined. Then, while a plane which included the measuring point P and was parallel to the surface of the substrate was taken as a reference plane (horizontal plane), values of depths from the reference plane (the differences each obtained by subtracting the height from the substrate at one of the measuring points from the value of the height from the substrate at the measuring point P) were determined as the data of depth of concavities and convexities. The depth data of concavities and convexities could be determined by automatic calculation with software in E-sweep. The values determined by automatic calculation could be used as the data of depth of concavities and convexities. After the data of depth of concavities and convexities was determined at each measuring point as described above, the average value (m) of the depth distribution of the concavities and convexities could be determined by calculation according to the following formula (I):

[Formula I]

$$m = \frac{1}{N}\sum_{i=1}^{N} x_i \quad (I)$$

The average value (m) of depth distribution of concavities and convexities of the concave-convex pattern layer of the diffraction grating obtained in this example was 40.3 nm.

<Standard Deviation of Depths of Concavities and Convexities>

Similar to the method for measuring the average value (m) of the depth distribution, the data of depth of the concavities and convexities were obtained by performing a measurement at 16384 or more measuring points (vertical: 128 points× horizontal: 128 points) in a measuring region of 3 μm square of the concave-convex pattern layer. In this example, a measurement was performed adopting 65536 measuring points (vertical: 256 points×horizontal: 256 points). Thereafter, the average value (m) of the depth distribution of the concavities and convexities and the standard deviation (σ) of depths of the concavities and convexities were calculated on the basis of the data of depth of concavities and convexities depth data of the measuring points. Note that, the average value (m) could be determined by calculation according to the formula (I) as described above. Meanwhile, the standard deviation (σ) of depths of the concavities and convexities could be determined by calculation according to the following formula (II):

[Formula II]

$$\sigma = \sqrt{\frac{1}{N}\sum_{i=1}^{N} (x_i - m)^2} \quad (II)$$

In the formula (II), "N" represents the total number of measuring points (the number of all the pixels), "$x_i$" represents data of depth of the concavities and convexities at the i-th measuring point, and "m" represents the average value of the depth distribution of the concavities and convexities. The standard deviation (σ1) of depths of concavities and convexities in the concave-convex pattern layer was 19.5 nm.

<Accumulation or Stacking of Auxiliary Layer>

The glass substrate, on which the concave-convex pattern layer (sol-gel material layer) as the diffraction grating obtained as described above was formed, was cut to have a size of 12 mm×20 mm, and organic matter and the like adhering to the glass substrate was removed by performing ultrasonic cleaning by use of IPA which is an organic solvent in order to eliminate foreign matter and the like adhering to the glass substrate. Subsequently, the glass substrate was subjected to the UV ozone process for 3 minutes in a state of being separated from the light source by 3 cm. Then, $TiO_2$ sol-gel solution (produced by Kojundo Chemical Lab. Co., Ltd., product name: Ti-05-P) was diluted with ethanol and IPA. The ethanol and IPA were used in the ratio by weight (%) of 80 to 12 (ethanol:IPA=80:12). The diluted solution was filtrated or filtered through a filter of 0.50 μmφ and the glass substrate was coated with the diluted solution by spin coating. The glass substrate was baked for 1 hour in an oven of 300 degrees Celsius. Accordingly, the $TiO_2$ film as the auxiliary layer was obtained on the pattern of the concave-convex pattern layer.

Subsequently, ITO film having a thickness of 80 nm was formed on the $TiO_2$ film by sputtering. Then, as the organic layer, a hole transporting layer (4,4',4"tris(9-carbazole)triphenylamine, thickness: 35 nm), a light emitting layer (tris(2-phenylpridinato)iridium(III) complex-doped 4,4',4"tris(9-carbazole)triphenylamine, thickness: 15 nm; tris(2-phenylpyridinato)iridium(III) complex-doped 1,3,5-tris(N-phenylbenzimidazole-2-yl)benzene, thickness: 15 nm), and an electron transporting layer (1,3,5-tris(N-phenylbenzimidazole-2-yl)benzene, thickness: 65 nm), were each stacked by a vapor deposition method. Further, a lithium fluoride layer (thickness: 1.5 nm) and a metal electrode (aluminum, thickness: 50 nm) were formed by the vapor deposition method. Accordingly, as depicted in FIG. 1, there was obtained the organic EL element 30 in which the concave-convex pattern layer 12, the $TiO_2$ film as the auxiliary layer 14, the transparent electrode as the first electrode 16, the organic layer 18, and the metal electrode as the second electrode 20 were formed on the substrate 10 in this order.

As for the film thickness of the $TiO_2$ film as the auxiliary layer 14, a measurement was performed at 100 measuring points by use of the cross-sectional TEM image of the organic EL element. In this situation, as depicted by the arrows in FIG. 1, the film thicknesses were measured at randomly selected 100 points by use of the cross-sectional TEM image of the organic EL element, and the average value thereof was calculated.

The standard deviation of depths of concavities and convexities of the $TiO_2$ film as the auxiliary layer obtained as described above was determined by use of the above formula (II) based on the analysis image by the atomic force microscope, in the same manner as the case of the concave-convex pattern layer of the diffraction grating substrate. The standard deviation (σ2) of depths of concavities and convexities of the TiO$_2$ film was 14.2 nm. Then, the shape change ratio (W=(σ2−σ1)/σ1) was obtained by the standard deviation (σ2) of depths of concavities and convexities of the TiO$_2$ film and the standard deviation (σ1) of depths of concavities and convexities of the concave-convex pattern layer obtained in advance, and the shape change ratio was 27.2%.

The table of FIG. 12 shows the film thickness of the TiO$_2$ film, the film thickness of the transparent electrode (ITO), the total film thickness thereof, the optical film thickness of the total film thickness, and the shape change ratio, of the organic EL element obtained in this example. The refractive index n1 of sol-gel material constituting the concave-convex pattern layer 12, the refractive index n2 of TiO$_2$ of the auxiliary layer 14, and the refractive index n3 of ITO of the first electrode 16 were n1=1.44, n2=2.03 to 2.11, and n3=2.03, at a wavelength λ of 550 nm, respectively. Regarding the sol-gel material constituting the concave-convex pattern layer 12, the reflectance ranging from 230 nm to 800 nm was measured by use of the microscopic reflectance spectral film thickness monitor FE-3000 (28CWA) produced by OTSUKA ELECTRONICS CO., LTD., and then the refractive index n1 and the film thickness were calculated based on the obtained spectrum, while the refractive index n1 being approximated by Cauchy dispersion formula. Regarding each of the auxiliary layer 14 and the first electrode 16, the transmittance ranging from 300 nm to 800 nm was measured by use of the ultraviolet-visible near-infrared spectral photometer V-570 produced by JASCO corporation, and then the refractive index n2, the refractive index n3 and the film thickness were calculated based on the obtained spectrum, while the refractive index n2 and refractive index n3 were each approximated by Cauchy dispersion formula. As described above, the refractive index n0 of the glass substrate 10 was 1.52, and thus n2≥n3>n1≤n0 was satisfied.

The directivity of light emission of the organic EL element obtained in this example was evaluated by the following method. That is, the organic EL element in a luminescent state was visually observed in all the directions (directions of all around 360°). Neither particularly bright sites nor particularly dark sites were observed when the organic EL element obtained in this Example was observed in any of the directions of all around 360°, and the brightness was uniform in all the directions. In this way, it was shown that the directivity of light emission of the organic EL element of the present invention was sufficiently low.

Example 2

An organic EL element was manufactured in the similar manner and conditions as Example 1, except that the film thickness of the TiO$_2$ film was 41 nm. The standard deviation of depths of concavities of convexities of the TiO$_2$ film was 11.5 nm. Then, the shape change ratio was obtained by the value of the standard deviation of depths of concavities and convexities of the TiO$_2$ film and the value of the standard deviation of depths of concavities and convexities of the concave-convex pattern of the diffraction grating substrate obtained in advance, and the shape change ratio was 41.4%. The table of FIG. 12 shows the film thickness of the TiO$_2$ film, the film thickness of the transparent electrode (ITO), the total film thickness thereat the optical film thickness of the total film thickness, and the shape change ratio, of the organic EL element obtained in this example.

Example 3

An organic EL element was manufactured in the similar manner and conditions as Example 1, except that the film thickness of the TiO$_2$ film was 53 nm. The standard deviation of depths of concavities of convexities of the TiO$_2$ film was 8.0 nm. Then, the shape change ratio was obtained by the value of the standard deviation of depths of concavities and convexities of the TiO$_2$ film and the value of the standard deviation of depths of concavities and convexities of the concave-convex pattern of the diffraction grating substrate obtained in advance, and the shape change ratio was 59.3%. The table of FIG. 12 shows the film thickness of the TiO$_2$ film, the film thickness of the transparent electrode (ITO), the total film thickness thereof, the optical film thickness of the total film thickness, and the shape change ratio, of the organic EL element obtained in this example.

Example 4

An organic EL element was manufactured in the similar manner and conditions as Example 1, except that the film thickness of the TiO$_2$ film was changed to 74 nm and that the film thickness of the transparent electrode (ITO) was changed to 120 nm. The standard deviation of depths of concavities of convexities of the TiO$_2$ film was 7.0 nm. Then, the shape change ratio was obtained by the value of the standard deviation of depths of concavities and convexities of the TiO$_2$ film and the value of the standard deviation of depths of concavities and convexities of the concave-convex pattern of the diffraction grating substrate obtained in advance, and the shape change ratio was 64.1%. The table of FIG. 12 shows the film thickness of the TiO$_2$ film, the film thickness of the transparent electrode (ITO), the total film thickness thereof, the optical film thickness of the total film thickness, and the shape change ratio, of the organic EL element obtained in this example.

Example 5

An organic EL element was manufactured in the similar manner and conditions as Example 1, except that a hemispherical lens as the lens layer 22 was provided on the outside surface of the substrate 10 as depicted in FIG. 2. A hemispherical lens (produced by Sakai Glass Engineering Co., Ltd.) with a diameter of 10 mm was attached to the surface of the substrate 10 by use of refractive index liquid (produced by Shimadzu Corporation) as adhesive. Both of the hemispherical lens and the refractive index liquid have the refractive index of n=1.52 (λ=550 nm). The semispherical lens was arranged so that the center of bottom surface of the semispherical lens overlapped with the center of a light-emitting pixel (center of the organic EL element). As shown in the table of FIG. 12, the film thickness of the TiO$_2$ film, the film thickness of the transparent electrode (ITO), the total film thickness thereof, the optical film thickness of the total film thickness, and the shape change ratio, of the organic EL element obtained in this example, were the same as those of the organic EL element of Example 1.

Example 6

An organic EL element was manufactured in the similar manner and conditions as Example 2, except that a hemispherical lens as the lens layer 22 was provided on the outside surface of the substrate 10 as depicted in FIG. 2. As the hemispherical lens, the same hemispherical lens as that used in Example 5 was attached to the substrate in the similar manner as Example 5. As shown in the table of FIG. 12, the film thickness of the TiO$_2$ film, the film thickness of the transparent electrode (ITO), the total film thickness thereof, the optical film thickness of the total film thickness, and the shape change ratio, of the organic EL element obtained in this example, were the same as those of the organic EL element of Example 2.

Example 7

An organic EL element was manufactured in the similar manner and conditions as Example 3, except that a hemispherical lens as the lens layer 22 was provided on the outside surface of the substrate 10 as depicted in FIG. 2. As the hemispherical lens, the same hemispherical lens as that used in Example 5 was allowed to adhere on the substrate in the similar manner as Example 5. As shown in the table of FIG. 12, the film thickness of the $TiO_2$ film, the film thickness of the transparent electrode (ITO), the total film thickness thereof, the optical film thickness of the total film thickness, and the shape change ratio, of the organic EL element obtained in this example, were the same as those of the organic EL element of Example 3.

Comparative Example 1

Figure 7:
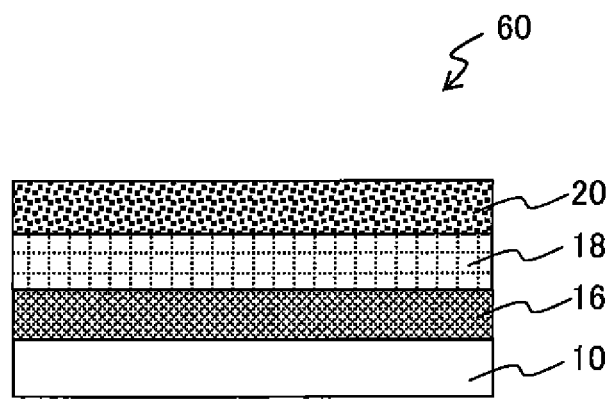
FIG. 7 is a schematic cross-sectional view depicting a cross-section structure of an organic EL element of Comparative Example 1.

An organic EL element was manufactured in the similar manner and conditions as Example 1, except that the concave-convex structure (concave-convex pattern layer) and the $TiO_2$ film, those of which constituted the diffracting grating, were not provided. FIG. 7 shows the cross-section structure of an organic EL element 60 manufactured in Comparative Example 1. The transparent electrode as the first electrode 16 was directly formed on a flat glass substrate 10, and thus no concave-convex shape appeared in any of the layers. The table of FIG. 12 shows the film thickness (zero) of the $TiO_2$ film, the film thickness of the transparent electrode (ITO), the total film thickness thereof, the optical film thickness of the total film thickness, and the shape change ratio, of the organic EL element obtained in this comparative example.

Comparative Example 2

Figure 8:
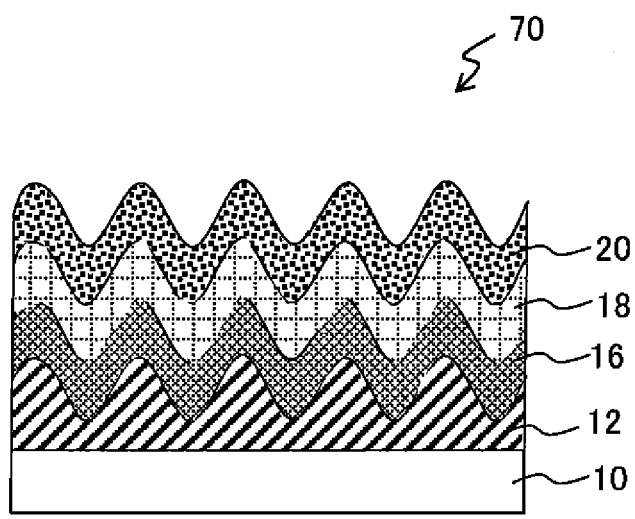
FIG. 8 is a schematic cross-sectional view depicting a cross-section structure of an organic EL element of Comparative Example 2.

An organic EL element was manufactured in the similar manner and conditions as Example 1, except that the $TiO_2$ film as the auxiliary layer was not provided. FIG. 8 shows the cross-section structure of an organic EL element 70 manufactured in Comparative Example 2. The concave-convex shape of the concave-convex pattern layer 12 on the diffraction grating substrate was transferred to the first electrode 16, the organic layer 18, and the second electrode 20 as it is (without change of the shape). The table of FIG. 12 shows the film thickness (zero) of the $TiO_2$ film, the film thickness of the transparent electrode (ITO), the total film thickness thereof, the optical film thickness of the total film thickness, and the shape change ratio, of the organic EL element obtained in this comparative example.

Comparative Example 3

Figure 9:
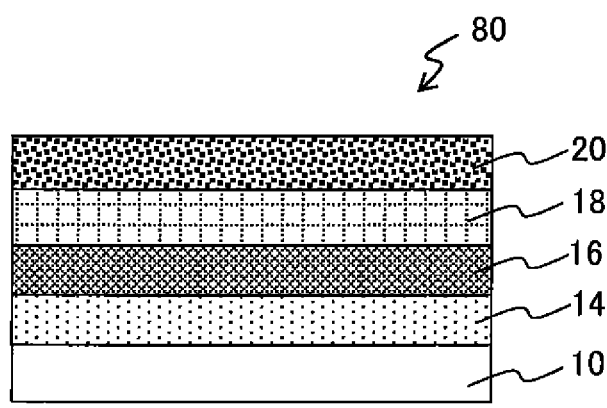
FIG. 9 is a schematic cross-sectional view depicting a cross-section structure of an organic EL element of Comparative Example 3.

An organic EL element was manufactured in the similar manner and conditions as Example 1, except that the concave-convex pattern layer was not provided. FIG. 9 shows the cross-section structure of an organic EL element 80 manufactured in Comparative Example 3. There was no concave-convex shape on the substrate 10, and thus all of the auxiliary layer 14, the first electrode 16, the organic layer 18, and the second electrode 20 had flat surfaces. The table of FIG. 12 shows the film thickness of the $TiO_2$ film, the film thickness of the transparent electrode (ITO), the total film thickness thereof, the optical film thickness of the total film thickness, and the shape change ratio, of the organic EL element obtained in this comparative example.

Comparative Example 4

Figure 10:
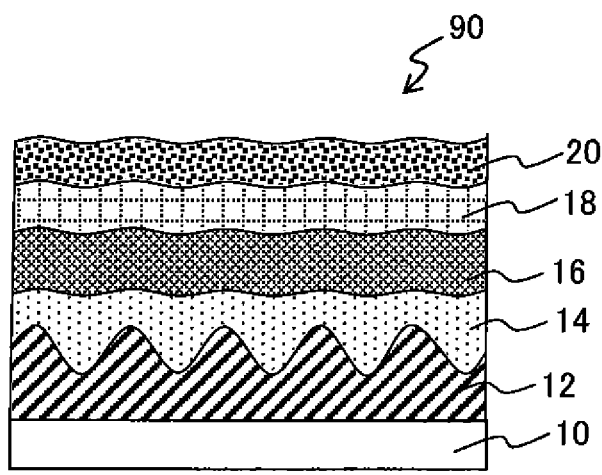
FIG. 10 is a schematic cross-sectional view depicting a cross-section structure of an organic EL element of Comparative Example 4.
Figure 11:
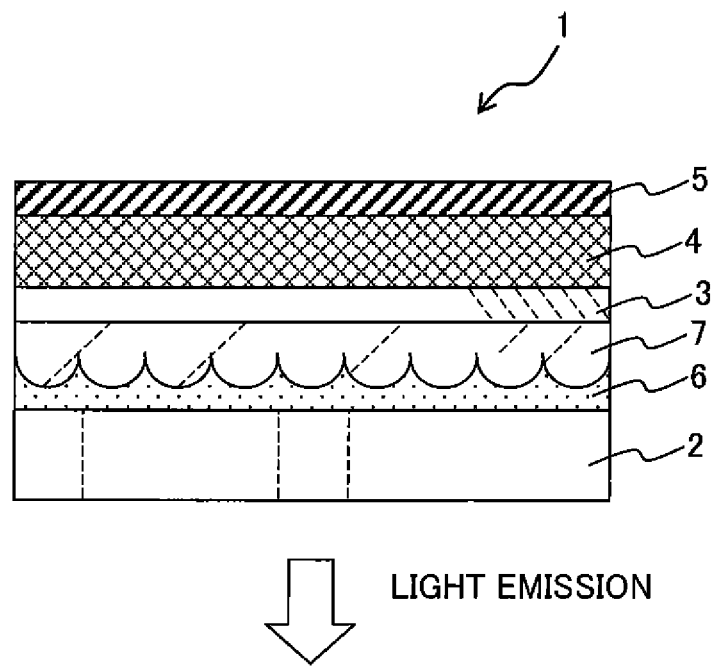
FIG. 11 is a schematic cross-sectional view depicting a cross-section structure of an organic EL element disclosed in Japanese Patent Application Laid-open No. 2011-48937.

An organic EL element was manufactured in the similar manner and conditions as Example 1, except that the film thickness of the $TiO_2$ film was 100 nm. The standard deviation of depths of concavities of convexities of the $TiO_2$ film was 4.9 nm. Then, the shape change ratio was obtained by the value of the standard deviation of depths of concavities and convexities of the $TiO_2$ film and the value of the standard deviation of depths of concavities and convexities of the concave-convex pattern of the diffraction grating substrate obtained in advance, and the shape change ratio was 75%. As depicted in FIG. 10, the film thickness of the auxiliary layer 14 of an organic EL element 90 obtained in this comparative example was thicker than those obtained in examples, and thus the surface of the auxiliary layer 14 had a nearly-flat structure. As a result, the first electrode 16, the organic layer 18, and the second electrode 20 are considered to also have planar or flat surfaces. The table of FIG. 12 shows the film thickness of the $TiO_2$ film, the film thickness of the transparent electrode (ITO), the total film thickness thereof, the optical film thickness of the total film thickness, and the shape change ratio, of the organic EL element obtained in this comparative example.

Comparative Example 5

An organic EL element was manufactured in the similar manner and conditions as Example 1, except that the film thickness of the $TiO_2$ film was changed to 96 nm and that the film thickness of the transparent electrode (ITO) was changed to 120 nm. The standard deviation of depths of concavities of convexities of the $TiO_2$ film was 5.9 nm. Then, the shape change ratio was obtained by the value of the standard deviation of depths of concavities and convexities of the $TiO_2$ film and the value of the standard deviation of depths of concavities and convexities of the concave-convex pattern of the diffraction grating substrate obtained in advance, and the shape change ratio was 74%. Therefore, the surface of the $TiO_2$ film is considered to have the shape of concave-convex surface as depicted in FIG. 10, similar to Comparative Example 4. The table of FIG. 12 shows the film thickness of the $TiO_2$ film, the film thickness of the transparent electrode (ITO), the total film thickness thereof, the optical film thickness of the total film thickness, and the shape change ratio, of the organic EL element obtained in this comparative example.

Comparative Example 6

An organic EL element was manufactured in the similar manner and conditions as Comparative Example 1, except that a hemispherical lens as the lens layer 22 was provided on the outside surface of the substrate 10 as depicted in FIG. 2. As the hemispherical lens, the same hemispherical lens as that used in Example 5 was attached to the substrate in the similar manner as Example 5. As shown in the table of FIG. 12, the film thickness of the $TiO_2$ film, the film thickness of the transparent electrode (ITO), the total film thickness thereof, the optical film thickness of the total film thickness, and the shape change ratio, of the organic EL element obtained in this Comparative Example, were the same as those of the organic EL element of Comparative Example 1.

Comparative Example 7

An organic EL element was manufactured in the similar manner and conditions as Comparative Example 2, except that a hemispherical lens as the lens layer 22 was provided on the outside surface of the substrate 10 as depicted in FIG. 2. As the hemispherical lens, the same hemispherical lens as that used in Example 5 was attached to the substrate in the similar manner as Example 5. As shown in the table of FIG. 12, the film thickness of the $TiO_2$ film, the film thickness of the transparent electrode (ITO), the total film thickness thereof, the optical film thickness of the total film thickness, and the shape change ratio, of the organic EL element obtained in this Comparative Example, were the same as those of the organic EL element of Comparative Example 2.

[Relation Between $TiO_2$ Film and Shape Change Ratio]

Figure 5:
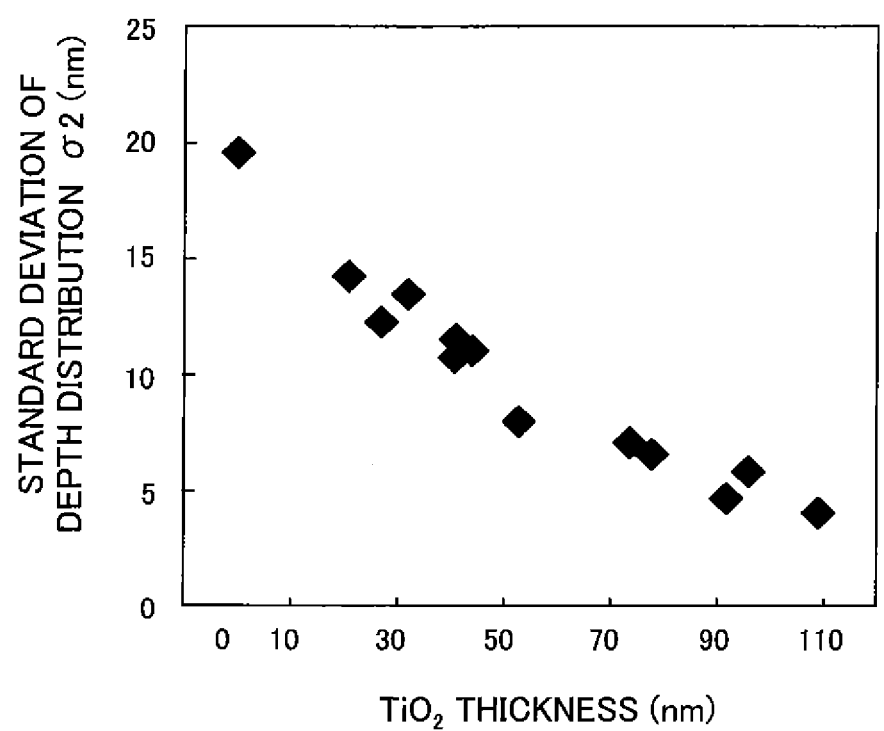
FIG. 5 is a graph showing the standard deviation of the shape (depths) of concavities and convexities formed on a surface of a $TiO_2$ film on a transparent electrode side with respect to the thickness of the $TiO_2$ film in the organic EL element of the present invention.
Figure 6:
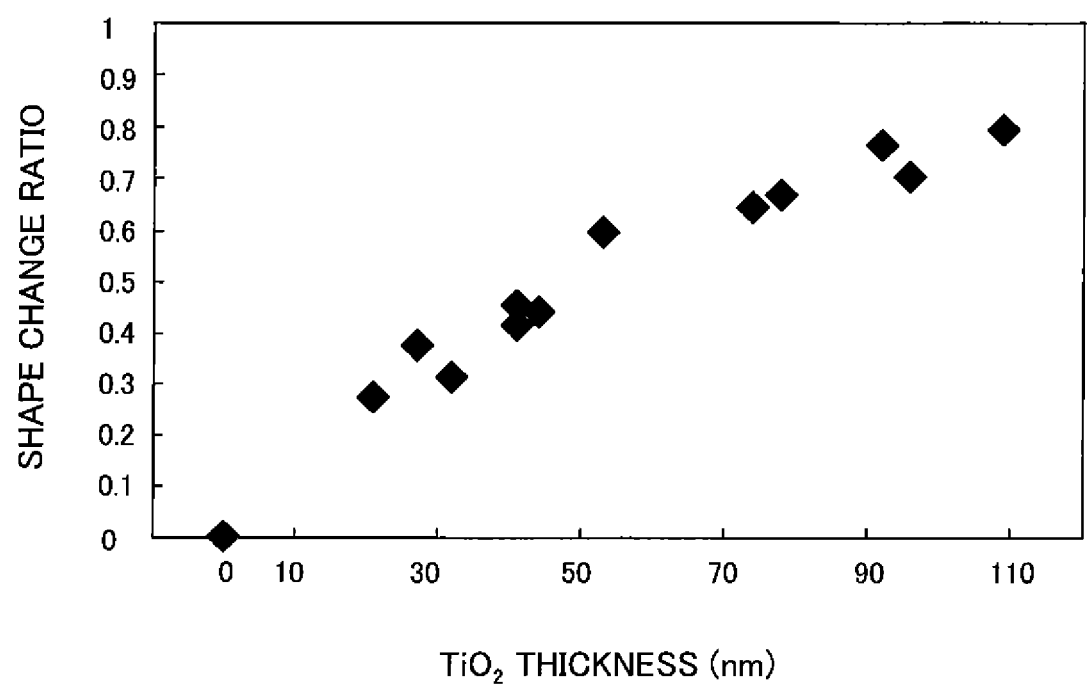
FIG. 6 is a graph showing the shape change ratio with respect to the thickness of an auxiliary layer ($TiO_2$ film) in the organic EL element of the present invention.

The diffraction grating substrate obtained in Example 1 was coated with the $TiO_2$ film having various film thicknesses. Then, the standard deviation $\sigma 2$ of depths of each of the $TiO_2$ films having one of the various film thicknesses was obtained in the similar manner as Example 1. The graph of FIG. 5 shows the change of the standard deviation $\sigma 2$ of depths of the $TiO_2$ film with respect to the thickness of the $TiO_2$ film. The results obtained in Examples 1 to 4 and Comparative Examples 1 to 5 are also included in the plot of the graph of FIG. 5. Further, the ratio of shape change (the change ratio of the standard deviation $\sigma 2$ of depths of the $TiO_2$ film with respect to the standard deviation $\sigma 1$ of depths of the concave-convex pattern layer constituting the diffraction grating) was obtained in the similar manner as Example 1 based on the value of film thickness of each of the $TiO_2$ films having one of various film thicknesses. The graph of FIG. 6 shows the change in the shape change ratio with respect to the film thickness of the $TiO_2$ film, and the following facts are understood therefrom. That is, in a case that the film thickness of the $TiO_2$ film is not more than 10 nm, the shape of the $TiO_2$ film follows the concave-convex shape of the diffraction grating substrate. The shape change ratio of the $TiO_2$ film is increased as the film thickness of the $TiO_2$ film is increased, and thus the $TiO_2$ film is gradually planarized or flattened.

[Evaluation of Light Emission Efficiency of Organic EL Element]

The light emission efficiency of the organic EL element obtained in each of Examples 1 to 7 and Comparative Examples 1 to 7 was measured by the following method. That is, voltage was applied to the obtained organic EL element, and then the applied voltage V and a current I flowing through the organic EL element were measured with a source measurement instrument (manufactured by ADC CORPORATION, R6244), and a total luminous flux amount L was measured with a total flux measurement apparatus manufactured by Spectra Co-op. From the thus obtained measured values of the applied voltage V, the current I, and the total luminous flux amount L, a luminance value L' was calculated. Here, the following calculation formula (F1) was used to calculate the current efficiency of the organic EL element:

$$\text{Current efficiency} = (L'/I) \times S \quad (F1)$$

In the above formula, S is a light-emitting or luminescent area of the element. Noted that the value of the luminance L' was calculated on the assumption that light distribution characteristic of the organic EL element followed Lambert's law, and the following calculation formula (F2) was used:

$$L' = L/\pi/S \quad (F2)$$

The table of FIG. 12 shows the current efficiency of the organic EL element manufactured in each of Examples 1 to 7 and Comparative Examples 1 to 7 at a luminance of 10000 cd/m². The current efficiency of the organic EL element manufactured in each of Examples 1 to 3 was not less than 70 cd/A. The current efficiency of the organic EL element of Example 4 was lower than the current efficiency of the organic EL element manufactured in each of Examples 1 to 3. The reason thereof is considered as follows. That is, the film thickness of the transparent electrode of the organic EL element manufactured in Example 4 was thicker than that of the organic EL element manufactured in each of Examples 1 to 3, and the total film thickness of the auxiliary layer and the transparent electrode in the organic EL element manufactured in Example 4 was thicker than that of the organic EL element manufactured in each of Examples 1 to 3. As a result, regarding the organic Element of Example 4, the light generated in the organic layer was more likely to stationary stand in the two layers of the auxiliary layer and the transparent electrode. Further, the reason why the organic EL elements manufactured in Comparative Examples 1 and 3 both had a low current efficiency is as follows. That is, since there was no concave-convex layer constituting the diffraction grating in the organic EL element manufactured in each of Comparative Examples 1 and 3, the light was reflected at the interference between the substrate and an upper layer of the substrate and the light was not extracted from the outside surface of the substrate sufficiently. Further, the reason why the organic EL elements manufactured in Comparative Examples 4 and 5 both had a low current efficiency is as follows. That is, even though the organic EL element manufactured in each of Comparative Examples 4 and 5 had the auxiliary layer and the concave-convex structure constituting the diffraction grating, the shape change ratio exceeded 70%, and thus the second concave-convex shape of the auxiliary layer was planarized or flattened too much.

Regarding the organic EL element manufactured in each of Examples 5 to 7 and Comparative Examples 6 and 7, the following fact has been found. That is, the hemispherical lens was provided in the substrate on the light-emitting surface side, and thus the current efficiency was improved greatly (60% or more) in each of the examples.

[Evaluation of Yield of Organic EL Element]

The voltage was continuously applied on the organic EL element manufactured in each of Examples 1 to 7 and Comparative Examples 1 to 7 so that the organic EL element was driven with a constant current in which the current density flowing through the organic EL element was 20 mA/cm². Then, the number of elements which leaked in 24 hours and stopped light-emitting was counted, and yield (%) was evaluated based on the obtained result. The light-emitting pixel of the organic EL element had 3 mm in length and 3 mm in width. The organic EL element manufactured in each of Examples 1 to 7 and Comparative Examples 1 to 7 was sealed with UV curable resin and cap glass in nitrogen atmosphere, and the organic EL element was taken out of the nitrogen atmosphere and put into the atmosphere. Then, the organic EL element was evaluated in a room at a temperature of 25 degrees Celsius and humidity of 45%. The luminance was measured once every 2 minutes. Each of the results is shown in the table of FIG. 12. The yield of the organic EL element in each of Examples 1 to 7 was 90% and the yield of the organic EL element in each of Comparative Examples 2 and 7 was 70%. It was confirmed that many cracks occurred in the auxiliary layer ($TiO_2$) of the organic EL element of Comparative Example 5. The reason thereof is considered that the total film thickness of the auxiliary layer and the transparent electrode in the organic EL element of Comparative Example 5 exceeded 200 nm.

In the organic EL element manufactured in each of Examples, both the concave-convex pattern layer and the auxiliary layer stacked thereon are made of the sol-gel material, and thus the adhesion property between the auxiliary layer and the concave-convex pattern is good. Further, heat resistance, mechanical strength, and chemical resistance are superior in the organic EL element manufactured in each of Examples. Therefore, in the organic EL manufacturing process, the organic EL element manufactured in each of Examples can satisfactorily withstand a film formation step performed under a high temperature atmosphere, $UV/O_3$ ozone cleaning, brushing, a cleaning step using various cleaning liquids such as acid and alkali solvents, and a patterning step using a developer and an etching liquid.

In a case that the organic EL element manufactured in each of Examples is used outside or outdoors, it is possible to suppress the deterioration due to sunlight as compared with the case in which the curable resin substrate is used. Further, in a case that the curable resin as described above is kept for a long period under high temperature because of, for example, the generation of heat at the time of emitting light, there is fear that the curable resin deteriorates to cause yellow discoloration and/or generate gas. Thus, it is difficult to use the organic EL element using the resin substrate for a long period of time. In contrast, the organic EL element with the concave-convex pattern layer manufactured by use of the sol-gel material is less likely to deteriorate.

In the above description, the present invention was explained by using examples. The present invention, however, is not limited to the above examples, and can be appropriately modified within the range of technical ideas described in the claims.

The organic EL element of the present invention is capable of preventing the occurrence of leak current effectively while maintaining a good light extraction efficiency. Thus, the organic EL element of the present invention is suitable for various uses such as a display and an illumination device which are required to have uniform lighting, and further the organic EL element of the present invention contributes to energy conservation.

What is claimed is:

1. An organic EL element, comprising:
    a concave-convex pattern layer having a first concave-convex shape, a first electrode, an organic layer, and a second electrode layer formed on a substrate in this order; and
    an auxiliary layer provided between the concave-convex pattern layer and the first electrode,
    wherein a surface of the auxiliary layer on a side of the first electrode has a second concave-convex shape; and
    a change ratio of a standard deviation of depths of the second concave-convex shape with respect to a standard deviation of depths of the first concave-convex shape is 70% or less.

2. The organic EL element according to claim 1, wherein the change ratio of the standard deviation of the depths of the second concave-convex shape with respect to the standard deviation of the depths of the first concave-convex shape is in a range of 20% to 70%.

3. The organic EL element according to claim 1, wherein a total optical film thickness of the auxiliary layer and first electrode is in a range of 160 nm to 400 nm.

4. The organic EL element according to claim 1, wherein the first electrode is made of ITO and has a film thickness of 80 nm or more.

5. The organic EL element according to claim 1, wherein the concave-convex pattern layer and the auxiliary layer are made of an inorganic material.

6. The organic EL element according to claim 1, wherein the concave-convex pattern layer is made of silica.

7. The organic EL element according to claim 1, wherein, in a case that refractive indexes of the substrate, the concave-convex pattern layer, the auxiliary layer, and the first electrode are represented by n0, n1, n2, and n3, respectively, the following relation:
    $n2 \geq n3 > n1 \leq 0$ is satisfied.

8. The organic EL element according to claim 1, wherein the concave-convex pattern layer includes an irregular concave-convex pattern in which orientations of concavities and convexities have no directivity.

9. The organic EL element according to claim 1, wherein an average pitch of concavities and convexities of the concave-convex pattern layer is in a range of 100 nm to 1500 nm and an average height of concavities and convexities of the concave-convex pattern layer is in a range of 20 nm to 200 nm.

10. A method for manufacturing the organic EL element as defined in claim 1, comprising:
    forming the concave-convex pattern layer, the auxiliary layer, the first electrode, the organic layer, and the second electrode layer on the substrate in this order; and
    forming the auxiliary layer to make the surface of the auxiliary layer on the side of the first electrode have the second concave-convex shape,
    wherein the change ratio of the standard deviation of depths of the second concave-convex shape with respect to the standard deviation of depths of the first concave-convex shape is 70% or less.

11. The method for manufacturing the organic EL element according to claim 10, wherein the concave-convex pattern layer is formed by coating the substrate with a sol-gel material and then pressing a mold against the substrate.

* * * * *